United States Patent [19]
DiStefano et al.

[11] Patent Number: 5,590,460
[45] Date of Patent: Jan. 7, 1997

[54] METHOD OF MAKING MULTILAYER CIRCUIT

[75] Inventors: Thomas H. DiStefano, Monte Sereno; John W. Smith, Palo Alto; Konstantine N. Karavakis, Cupertino; Zlata Kovac, Los Gatos; Joseph Fjelstad, Sunnyvale, all of Calif.

[73] Assignee: Tessera, Inc., San Jose, Calif.

[21] Appl. No.: 277,336

[22] Filed: Jul. 19, 1994

[51] Int. Cl.$^6$ ........................................ H05K 3/36
[52] U.S. Cl. .................. 29/830; 174/262; 174/265
[58] Field of Search .............................. 29/830, 831, 825; 174/262, 265

[56] References Cited

U.S. PATENT DOCUMENTS

| | | |
|---|---|---|
| 3,316,618 | 5/1967 | Guarracini . |
| 3,316,619 | 5/1967 | Beelitz . |
| 3,509,270 | 4/1970 | Dube et al. . |
| 3,541,222 | 11/1970 | Parks et al. . |
| 3,616,532 | 12/1971 | Beck . |
| 3,739,469 | 6/1973 | Dougherty, Jr. . |
| 3,795,037 | 3/1974 | Luttmer . |
| 3,862,790 | 1/1975 | Davies et al. . |
| 4,074,342 | 2/1978 | Honn et al. ............... 29/830 X |
| 4,225,900 | 9/1980 | Ciccio et al. . |
| 4,249,302 | 2/1981 | Crepeau . |
| 4,528,072 | 7/1985 | Kurosawa et al. ............... 29/830 |
| 4,548,451 | 10/1985 | Benarr et al. . |
| 4,655,519 | 4/1987 | Evans et al. . |
| 4,685,210 | 8/1987 | King et al. ............... 29/830 |
| 4,695,870 | 9/1987 | Patraw . |
| 4,716,049 | 12/1987 | Patraw . |
| 4,729,809 | 3/1988 | Dery et al. . |
| 4,788,766 | 12/1988 | Burger et al. . |
| 4,793,814 | 12/1988 | Zifcak et al. . |
| 4,902,606 | 2/1990 | Patraw . |
| 4,924,353 | 5/1990 | Patraw . |
| 4,954,878 | 9/1990 | Fox et al. . |
| 5,047,830 | 9/1991 | Grabbe . |
| 5,129,142 | 7/1992 | Bindra et al. . |
| 5,131,852 | 7/1992 | Grabbe et al. . |
| 5,142,775 | 9/1992 | Wiley ............... 29/830 X |
| 5,152,695 | 10/1992 | Grabbe et al. . |
| 5,167,512 | 12/1992 | Walkup . |
| 5,173,055 | 12/1992 | Grabbe . |
| 5,224,265 | 6/1993 | Dux et al. . |
| 5,228,861 | 7/1993 | Grabbe . |
| 5,232,548 | 8/1993 | Ehrenberg et al. . |
| 5,282,312 | 2/1994 | DiStefano et al. . |

Primary Examiner—Carl J. Arbes
Attorney, Agent, or Firm—Lerner, David, Littenberg, Krumholz & Mentlik

[57] ABSTRACT

An interposer for interconnection between microelectronic circuit panels has contacts at its surfaces. Each contact has a central axis normal to the surface and a peripheral portion adapted to expand radially outwardly from the central axis responsive to a force applied by a pad on the engaged circuit panel. Thus, when the circuit panels are compressed with the interposers, the contacts expand radially and wipe across the pads. The wiping action facilitates bonding of the contacts to the pads, as by conductive bonding material carried on the contacts themselves.

34 Claims, 10 Drawing Sheets

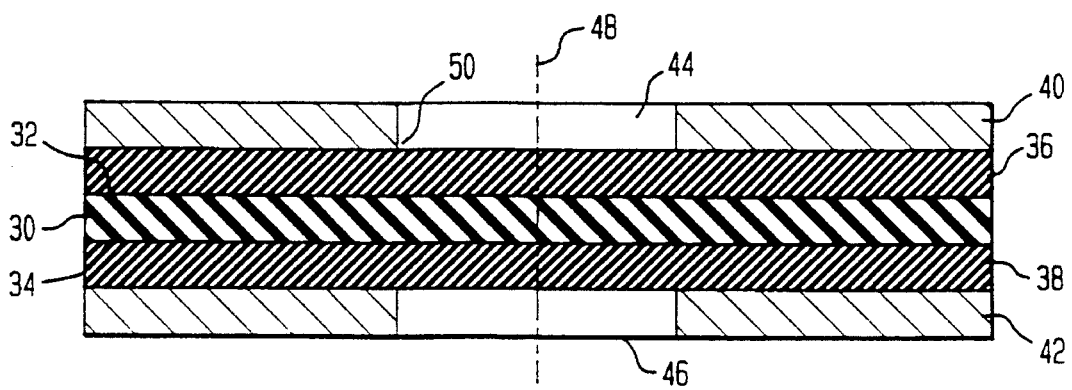
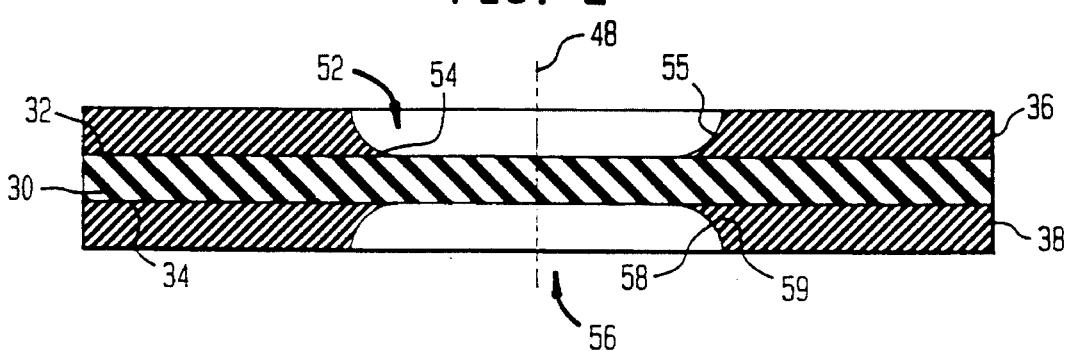
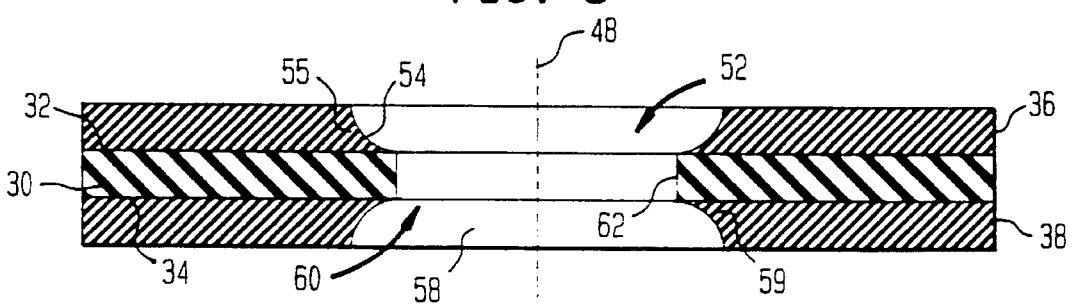
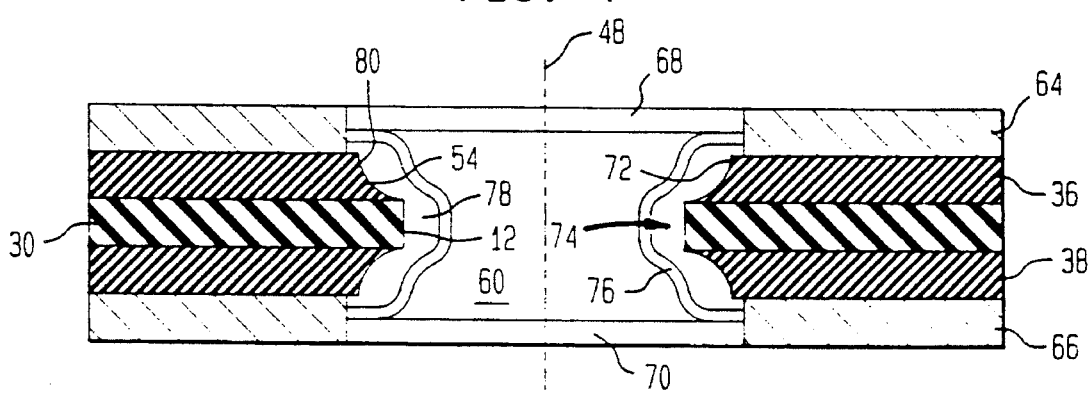

METHOD OF MAKING MULTILAYER CIRCUIT

FIELD OF THE INVENTION

The present invention relates to the field of electrical circuitry, and more particularly relates to layered circuit structures such as multi-layer circuit boards, to components and methods utilized in fabrication of such structures and to methods of making the same.

BACKGROUND OF THE INVENTION

Electrical components are commonly mounted on circuit panel structures such as printed circuit boards. Circuit panels ordinarily include a generally flat sheet of dielectric material with electrical conductors disposed on a major, flat surface of the sheet or on both major surfaces. The conductors are commonly formed from metallic materials such as copper and serve to interconnect the electrical components mounted to the board. Where the conductors are disposed on both major surfaces of the panel, the panel may have via conductors extending through the dielectric layer so as to interconnect the conductors on opposite surfaces. Multi-layer circuit panel assemblies have been made heretofore which incorporate plural, stacked circuit panels with additional layers of dielectric materials separating the conductors on mutually facing surfaces of adjacent panels in the stack. These multi-layer assemblies ordinarily incorporate interconnections extending between the conductors on the various circuit panels in the stack as necessary to provide the required electrical interconnections.

Electrical components which can be mounted to circuit panel structures include so-called "discrete" components and integrated circuits which include numerous transistors on a single chip. Chips of this nature can be mounted to commonly referred to as "chip carriers" which are specialized circuit panel structures. A chip carrier may be incorporated in a package which is mounted to a larger circuit board and interconnected with the remaining elements of the circuit. Alternatively, the chip can be mounted directly to the same circuit panel which carries other components of the system. This arrangement is ordinarily referred to as a "hybrid circuit". Relatively large circuit panels are commonly made of polymeric materials, typically with reinforcement such as glass, whereas very small circuit panels such as those used as semiconductor chip carriers may be formed from ceramics, silicon or the like.

There have been increasing needs for circuit panel structures which provide high density, complex interconnections. These needs are addressed by multilayer circuit panel structures. The methods generally used to fabricate multi-layer panel structures have certain serious drawbacks. Multi-layer panels are commonly made by providing individual, dual sided circuit panels with appropriate conductors thereon. The panels are then laminated one atop the other with one or more layers of uncured or partially cured dielectric material, commonly referred to as "prepregs" disposed between each pair of adjacent panels. Such a stack ordinarily is cured under heat and pressure to form a unitary mass. After curing, holes are drilled through the stack at locations where electrical connections between different boards are desired. The resulting holes are then coated or filled with electrically conductive materials, typically by plating the interiors of the holes to form what is called a plated through hole. It is difficult to drill holes with a high ratio of depth to diameter. Thus, the holes used in assemblies fabricated according to these prior methods must be relatively large and hence consume substantial amounts of space in the assembly. These holes ordinarily extend from the top or bottom of the stack. Even where interconnections are not required in the top or bottom layers, space must be provided for holes to pass through these layers so as to provide needed interconnections in the middle layers. Accordingly, substantial amounts of the available surface area on the panels must be allocated to the holes and to accommodate tolerance zones around the holes. Moreover, the electrical interconnections formed by depositing conductive materials in such drilled holes tend to be weak. The drilling method and the general nature of the laminates used therein is described, for example in Doherty, Jr., U.S. Pat. No. 3,793,469; and Guarracini, U.S. Pat. No. 3,316,618.

Various alternative approaches have been proposed. Parks et al., U.S. Pat. No. 3,541,222; Crepeau, U.S. Pat. No. 4,249,032; Luttmer, U.S. Pat. No. 3,795,037; Davies et al., U.S. Pat. No. 3,862,790, Fox U.S. Pat. No. 4,954,878, and Zifcak, U.S. Pat. No. 4,793,814 all relate generally to structures which have metallic or other conductive elements arranged at relatively closely spaced locations on a dielectric sheet with the conductive elements protruding through the dielectric sheet in both directions. Such a sheet may be sandwiched between a pair of circuit boards and the circuit boards may be clamped or otherwise held together so as to provide mechanical engagement between conductive elements on the adjacent faces of the circuit boards and the conductive elements of the composite sheet. In each of these arrangements, the conductive elements, the composite sheet or both is resilient or malleable so as to provide for close engagement between the conductive elements of the composite sheet and the conductors on the circuit boards.

Beck, U.S. Pat. No. 3,616,532 and Dube et al., U.S. Pat. No. 3,509,270 describe variants of this approach in which resilient elements are used with a fusible solder. These elements are mounted on insulating boards which are then stacked between printed circuit layers. The assembly is heated so as to melt the solder, thereby freeing the resilient elements so that the resilient elements and solder cooperatively form an interconnection between the adjacent circuit boards.

Evans et al, U.S. Pat. No. 4,655,519 describes a connector with numerous strip-like contact springs disposed in holes in a flat dielectric body, together with other spring elements. The ends of the strips protrude from opposite surfaces of the body. These are adapted to compress when electronic elements are engaged with the body surfaces, so that the ends of the strips engage pads on the electronic elements. Walkup, U.S. Pat. No. 5,167,512 discloses a further system using springs disposed in holes in a dielectric body.

Grabbe, U.S. Pat. No. 5,228,861 describes a connector having a sheet-like dielectric body with numerous generally X-shaped spring contact elements, each having four arms, lying on a first side of the sheet. Two arms of each X-shaped element are bent inwardly toward the sheet, and extend through holes in the sheet so that the tips of these arms protrude above the second, opposite face of the sheet. The other two arms are bent away from the sheet, and hence protrude from the first surface. When the connector is placed between circuit panels, each X-shaped element is compressed between mating pads of the circuit panels, causing the bent arms to flatten and causing the tips of the arms to wipe the surfaces of the pads. After engagement, the contact is maintained by the resilience of the arms.

Bernarr et al, U.S. Pat. No. 4,548,451 describes a connector or interposer having a sheet-like elastomeric body with crushable protrusions extending outwardly from oppositely-directed surfaces. Tabs formed from a metal-coated flexible film extend on both surfaces of the body, and overlie the protrusions. The tabs on opposite sides are connected to one another by vias. When the interposer is engaged between circuit panels, the tabs and posts are crushed between contact pads on opposing panels, and the tabs assertedly wipe the pads for more effective contact. The tabs are maintained in engagement with the pads by the resilience of the elastomeric sheet and the posts; there is no permanent bond formed.

Patraw, U.S. Pat. Nos. 4,716,049; 4,902,606; and 4,924,353 describe microelectronic connection schemes using deformable contacts protruding upwardly from a substrate. Each contact has a dome-like tip and a plurality of legs extending downwardly from the tip to the substrate. These contacts are formed by selective deposition of aluminum on a pedestals of a fugitive material such as potassium chloride or a photoresist using a shaped mask. The pedestals are removed after deposition.

Dery et al., U.S. Pat. No. 4,729,809 discloses the use of an anisotropically conductive adhesive material disposed between opposing sublaminates, the adhesive composition having sufficient conductivity across the relatively small spaces between conductors on adjacent layers to form an electrical interconnection therebetween, but having low conductivity across the relatively large spaces between adjacent conductors on the same surface so that it does not produce an unwanted lateral interconnection along one surface.

Berger et al., U.S. Pat. No. 4,788,766 uses conductor bearing circuit lamina having hollow, eyelet-like via structures, each such via structure having a rim protruding vertically from the surrounding structure. Each such via structure is provided with a thin layer of a conductive bonding material. In making the multi-layer structure, dielectric bonding films are interposed between the circuit bearing lamina. The dielectric films have apertures in locations corresponding to the locations of the eyelet structures, in the adjacent circuit bearing lamina. Thus, the upstanding rims of the eyelet structures can bear upon one another when the assembly is forced together under heat and pressure. The layers of conductive bonding material on the rims of the abutting eyelets are said to form bonds between the abutting eyelet structures.

Other structures for forming multilayer electronic assemblies are taught in Dux et al., U.S. Pat. No. 5,224,265 and Ehrenberg et al. U.S. Pat. No. 5,232,548, which use sublaminates made by depositing a dielectric material onto a perforated metal sheet, as by vapor-phase polymerization or electrophoretic bonding, to form a dielectric sheet with vias. The vias are filled with a flowable joining material such as a metal-loaded polymer. These structures are stacked and heated to join the vias into unitary vertical conductors.

Other multilayer assembly systems using flowable conductive materials to join structures in stacked elements are disclosed in Bindra et al., U.S. Pat. No. 5,129,142. Still further improvements are disclosed U.S. Pat. No. 5,282,312 of Thomas H. DiStefano et al. The '312 patent discloses as background certain lamination techniques or methods of making multi-layer circuit assemblies using flowable conducting materials.

Despite these and other efforts in the art, there are needs for still further improvement.

SUMMARY OF THE INVENTION

The present invention addresses these needs.

One aspect of the present invention provides an interposer for making connections to electrical contacts on the surface of a microelectronic elements such as a circuit panel, a semiconductor chip or other element having a contact-bearing surface. The interposer includes a body having a first major surface, such that the body defines horizontal directions parallel to the first major surface and vertical directions perpendicular to the first major surface. The interposer further has a plurality of conductors in the body, such as via conductors extending in or through the body. The interposer further includes contacts at the first major surface of the body electrically connected to the conductors. Each contact extends over the first surface of the body generally radially outwardly from a central axis which is perpendicular to the first surface. Thus, each contact extends in a plurality of horizontal directions away from the axis and away from the junction of the contact with the conductor. Each contact has a periphery remote from the central axis. The contacts are adapted to deform so that the periphery of each contact will expand generally radially outwardly, away from the axis, in response to a force applied to the contact directed toward the body. In use, the contacts are engaged with corresponding connection pads of a circuit panel or other microelectronic element when the element is juxtaposed with the first surface of the interposer. The panel or other element can then be forced toward the body, so that the pads apply vertical forces to the contacts. As each contact expands outwardly in response to the vertical force, it wipes across the surface of the mating pad. The wiping action removes oxides and other contaminants from the mating surfaces to provide an effective, low-resistance electrical connection between the pads and the contacts and, in preferred embodiments, to facilitate bonding of the contacts and pads.

The contacts desirably are arranged to deform so that the periphery of each contact moves vertically downwardly toward the body as the periphery moves radially outwardly. In the initial, undeformed condition, the periphery of each contact may be spaced vertically above the surface of the body. Each contact may include a central portion adjacent the axis which may be in engagement the body, whereas a peripheral portion of the contact may extend radially outwardly from the central portion and vertically upwardly, away from the body. The central portion of each contact may be connected to a conductor, so that the contact extends radially outwardly, atop the surface of the body, from the conductor. Each contact may be generally in the form of a body of a revolution about the vertical central axis. Thus, the peripheral portion may be a shell in the form of an upwardly and outwardly flaring of revolution about the central axis. In this instance, the expanding action of the contact is reminiscent of the setting of a rivet.

Alternatively, the periphery of each contact may be non-circular. Thus, each contact may include a plurality of tabs extending generally radially away from the central axis, each such tab having a tip remote from the axis and remote from the conductor. Desirably, the tabs of each contact are disposed in a substantially symmetrical pattern about the central axis and about the junction with the conductor, so that the tabs extend generally symmetrically in radial directions away from the central axis, and away from the conductor. A preferred symmetrical pattern includes four tabs disposed at equally spaced intervals around the central axis, such that the tabs define a quatrefoil pattern.

When the tips of the tabs are engaged by a pad on a circuit panel or other microelectronic element and forced downwardly towards the body, the tip of each tab will bend downwardly and outwardly, away from the central axis. Thus, the tabs of the contact unfold away from one another, to provide an effective wiping action against the surface of the engaged pad. Although the present invention is not limited by any theory of operation, it is believed that this outward movement of the tab tips is produced at least in part by the bending of each tab generally around the radially inward or proximal end of the tab and around the adjacent regions of the body itself. The body surface may have depressions housing the central portions of the contacts, and may also have outwardly-flaring walls surrounding the depressions. Each tab may be arcuate, and may conform to the outwardly-flaring wall.

Preferably, the contacts include bonding materials adapted to facilitate the bonding of the contacts to a mating pad engaged therewith. The bonding material may be selected from a group consisting of solders, brazing alloys, diffusion bonding alloys, eutectic bonding alloys and conductive materials incorporating polymers. The contacts may be metallic and may be formed integrally with the associated conductors. The interposer body preferably is a lamellar structure, such as a sheet-like or platelike structure, and defines a second major surface facing in the opposite direction from the first major surface. At least some of the conductors may be through conductors having second ends disposed adjacent the second major surface. In this case, the interposer has second end contacts attached to the second ends of the conductors. Each such second end contact may be configured in the same manner as the first end contacts discussed above. Thus, each second end contact may extend radially outwardly away from a central axis which is perpendicular to the second surface, and may extend from a second end of a conductor connected at its first end to one of the contacts on the first surface. The contact desirably is adapted to deform so that the periphery will expand radically outwardly, away from the axis and from the conductor second end in response to a vertical force on the second end contact. Such interposers can be used, for example, between pairs of circuit panels or other microelectronic elements.

The contacts and the conductors may constitute portions of continuous, generally tubular vias extending through a hole in the body and flaring outwardly at both ends of the hole. The interposer body may have a heat activatable adhesive, a thermoplastic or other flowable dielectric material at the surfaces of the body, so that the interposer can form a substantially void free dielectric seal with the body of a circuit panel or other microelectronic element engaged therewith. Where the conductive bonding material on the contacts is activated by heat, the adhesive or the flowable dielectric material on the body may be arranged for activation at approximately the same temperature as the flowable conductive material.

A further aspect of the invention provides a microelectronic connection interposer having a body with a first horizontally extensive surface having a principal plane and a plurality of contacts disposed in an array on the body at said surface. Each contact includes a central portion and a peripheral portion extending outwardly from the central portion. The central portion may be recessed vertically from the principal plane of the surface, whereas the peripheral portion may extend at or vertically above the principal plane. Desirably, the peripheral portion of each contact is noncircular and may include tabs as aforementioned projecting away from the central portion. The body may include a plurality of indentation in the first surface, each such indentation having a central axis generally perpendicular to the first surface and having walls flaring generally radially outwardly up away from the central axis so that the indentation widens progressively from the base of the indentation to the opening of the recess at the principal plane.

Another aspect of the present invention provides methods of making a multi-layer circuit. A method according to this aspect of the present invention desirably includes the step of stacking a microelectronic element such as a circuit panel and an interposer so the first surface of the interposer confronts a surface of the microelectronic element. The interposer may be an interposer as described above, having a body, having conductors and having contacts joined to the conductors, each contact extending over the surface of the body and extending radially outwardly from its juncture with the conductor to a peripheral portion. The method includes the further step of compressing the stacked microelectronic element and interposer so as to forcibly engage the peripheral portions of the contacts with the pads of the microelectronic element, thereby expanding the peripheral portion of each contact radially outwardly, away from the central axis and away from the associated conductor. Thus, the peripheral portion of each contact moves horizontally with respect to the engaged pad and wipes the surface of the pad. Preferably, during the compressing step, each peripheral portion also moves vertically downwardly, i.e., toward or into the body of the interposer.

The stacking step may include the step of stacking a plurality of circuit panels and one or more interposers in interleaved, vertically alternating arrangements so that one interposer is disposed between each pair of circuit panels and so that oppositely directed first and second surfaces of each interposer confront the mating surfaces of the panels. In this arrangement, the conductors of each interposer desirably include through or via conductors extending through the body and having contacts at both ends of each conductor, on opposite surfaces of the interposer. The contacts on the opposite surfaces engage pads on the two neighboring circuit panels on opposite sides of the interposer. Thus, when the contacts are engaged with the pads of the circuit panels, the through conductors will interconnect the pads on the neighboring circuit panel with one another. In preferred processes according to this aspect of the present invention, the wiping action of the contacts provides for reliable electrical bonding between the circuit panels. Moreover, the vertical movement of the contact peripheral portions compensates for nonplanarity of the circuit panels and interposers. Preferred methods according to this aspect of the present invention can provide reliable interconnections and reliable multi-layer structures even with very small feature sizes. Thus, the spacings between adjacent pads on the circuit panels and between adjacent contacts on each surface of each interposer may be about 1.0 mm or less.

Preferably, the method includes the step of bonding the contacts of the interposers to the pads on the panels, by momentarily heating the stacked elements to activate an electrically conductive bonding material at interfaces between the contacts and contacts. Preferably, the method also includes a step of activating a flowable dielectric material such as an adhesive to flow at the interfaces between each of the interposer bodies and the adjoining microelectronic elements or panels so as to join the stacked elements into a substantially unitary mass. The flow of the dielectric material may occur concomitantly with the flow of the electrically conductive bonding material. Where the peripheral portions of the contacts overlie portions of the dielectric material of the interposer body, softening of the dielectric bonding material tends to facilitate vertical movement of the peripheral portions of the contacts. As the dielectric material softens, the peripheral portion of each contact may be displaced downwardly into the underlying dielectric material.

Further aspects of the present invention includes methods of making a circuit assembly including the steps of stacking microelectronic elements such as a circuit panel and an interposer in a vertically superposed arrangement so that a first horizontally extensive surface of the interposer confronts a horizontally extensive surface of the circuit panel and so that a plurality of electrically conductive contacts at the first surface of the interposer confront pads on the surface of the circuit panel. The method further includes the step of compressing the stacked microelectronic elements and the interposer vertically so as to forcibly engage the contacts with the pads and cause the contacts to deform so that at least a portion of each contact engaged with the pad moves horizontally with respect to the engaged contact and wipes the surface of the contact during the compressing step, and subsequently bonding each contact to the engaged pad, as by activating a bonding material at interfaces between the contacts and the pads by momentarily heating the stacked elements. The bonding step may include diffusion bonding, soldering, brazing, eutectic bonding, activation of a polymeric conductive adhesive or the like. The wiping action cleans the surfaces to facilitate effective bonding.

Still further aspects of the present invention provide methods of making microelectronic interposers. Methods according to this aspect of the present invention preferably include the steps of providing a body defining a first surface and providing a first temporary layer on the first surface so that the temporary layer has apertures therein. An electrically conductive structural material such as copper or another metal is deposited in each aperture so that a layer of the structural material extends within the aperture and extends over at least a portion of the temporary layer, thereby forming contacts. The method also includes the step of removing the temporary layer, leaving an outwardly extending peripheral portion of each contact spaced away from the surface of the body where the structural material was deposited on the temporary layer. Desirably, the body has holes extending inwardly from the first surface in registration with the apertures in the temporary layer and the structural material is deposited in the holes so that the conductors are formed integrally with the contacts.

Where the body has oppositely directed first and second surfaces, the holes in the body may extend from the first surface to the second surface and the method may include the step of providing a second temporary layer on the second surface with apertures in registration with the holes. Thus, the step of depositing the structural material may include the step of depositing the structural material in the apertures of the second temporary layer as well, so that the structural material extends over part of the second temporary layer. The method may further include a step of removing the second temporary layer thereby leaving contacts on the second surface integral with the conductors and with the contacts on the first surface. The holes and the apertures in the temporary layers may be formed so that walls of the holes of the body are substantially continuous with the walls of the apertures in the temporary layers. Thus, the step of forming the holes in the body may be performed after the step of applying the temporary layers with their respective apertures, as by removing material from the body using one or both of the temporary layers as masks.

Desirably, each aperture in each of the temporary layers has a central axis and the temporary layer defines a wall at each aperture flaring outwardly, away from the central axis of the aperture in the vertically upward and outward direction and away from the associated surface of the body. The step of depositing the structural material may include the step of depositing a thin layer of metal on these outwardly flaring walls. Thus, when the temporary layers are removed, the portions of the structural material overlying the outwardly flaring walls will be spaced from the surface of the body and will slope progressively upwardly away from the body in the radially outward direction from the central axis.

The step of providing the temporary layer may include the step of depositing the temporary layer material as an imperforate layer on the surface of the body and then forming the apertures by masking the imperforate layer so that the mask has openings. The masked layer may then be exposed to an isotropic etchant through the openings. Such treatment tends to form a generally cup-shaped surface. The structural material desirably is a metal such as copper, gold, nickel and the like which may be plated over the temporary layer. The temporary layer may be formed from a metal such as aluminum, tin or nickel, and the temporary layer may be removed by a process such as caustic etching, leaving the structural material intact. Alternatively, the temporary layer may include a layer of a polymeric material such as a resist, or other materials which can be removed without damaging the structural material.

Other aspects of the present invention provide methods of making microelectronic interposers using a body having a first surface, the first surface including a principal planar portion and a plurality of open indentations with vertical axes normal to the principal plane and with walls flaring outwardly away from the axes. Methods according to this aspect of the invention desirably include the step of depositing an electrically conductive structural material in the indentations to form a layer on the outwardly-flaring walls, and controlling the extent of the layers in horizontal directions, transverse to the axes, so that each layer forms a plurality of tabs extending generally radially from the axes. The horizontal extent of the layers may be controlled by selective deposition during the depositing step, or by selective removal, such as etching, after the depositing step.

The body desirably has two major surfaces as aforesaid, facing in opposite directions. The indentations on the two major surfaces desirably include pairs of coaxially aligned indentations which merge with one another to form continuous through holes or via holes extending through the entire body. The steps of providing the body may include the steps of providing a sheet having holes therein, as by etching the sheet from opposite sides to form holes tapering to narrowest points remote from the faces of the sheet, and then depositing a coating of a dielectric material on the sheet, and in the holes of the sheet, as by electrophoretic deposition. As further described below, the preferred methods according to this aspect of the invention provide unique curved tabs.

These and other objects have features and advantages of the present invention will be more readily apparent from the detailed description of the preferred embodiments set forth below, taken in conjunction with the accompanying drawings.

BRIEF DESCRIPTION OF TILE DRAWINGS

FIG. 1 is a fragmentary, diagrammatic sectional view depicting portions of an interposer during one step of a fabrication process according to one embodiment of the invention.

FIGS. 2, 3 and 4 are views similar to FIG. 1 but depicting the interposer during later stages of the same process.

Figure 10:
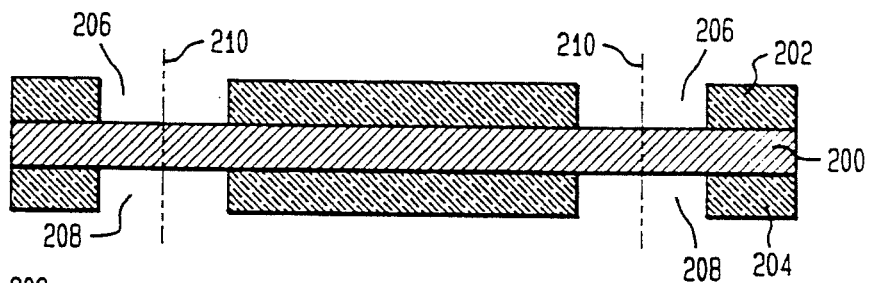
FIG. 10 is a fragmentary, diagrammatic sectional view depicting portions of an interposer during one step of a fabrication process according to another embodiment of the invention.
Figure 11:
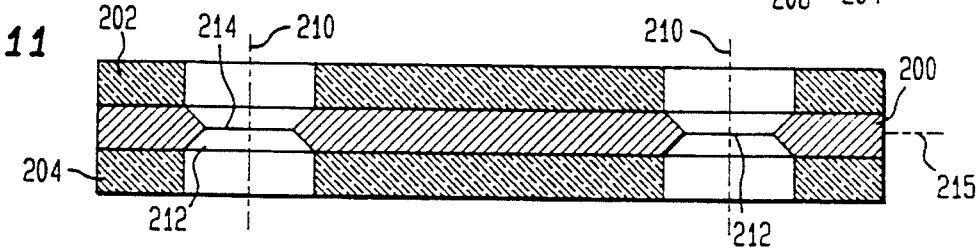
Figure 12:
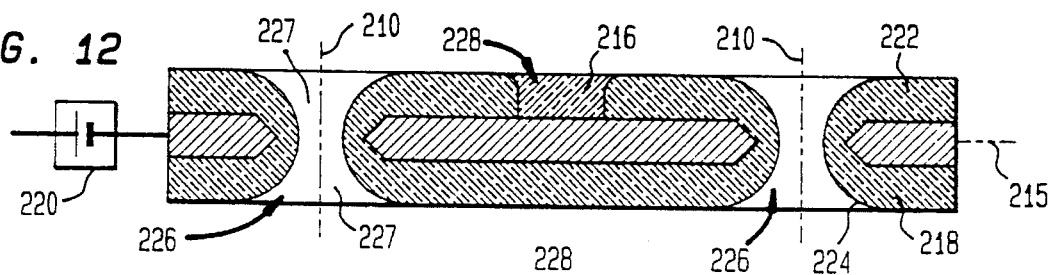
Figure 13:
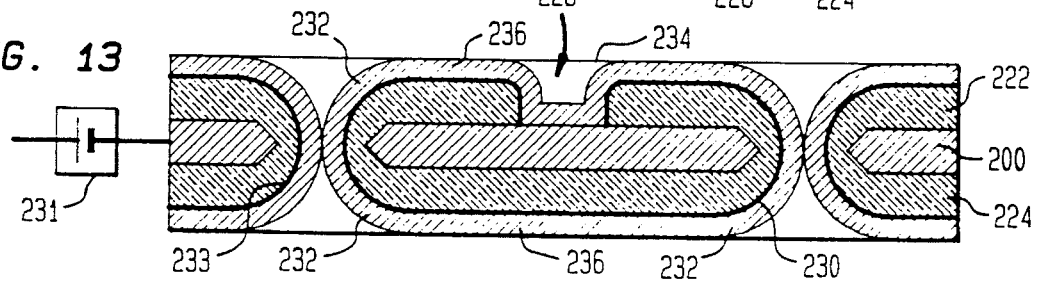

FIGS. 11 through 14 inclusive are views similar to FIG. 10 but depicting the interposer at progressively later stages of the fabrication process.

Figure 14:
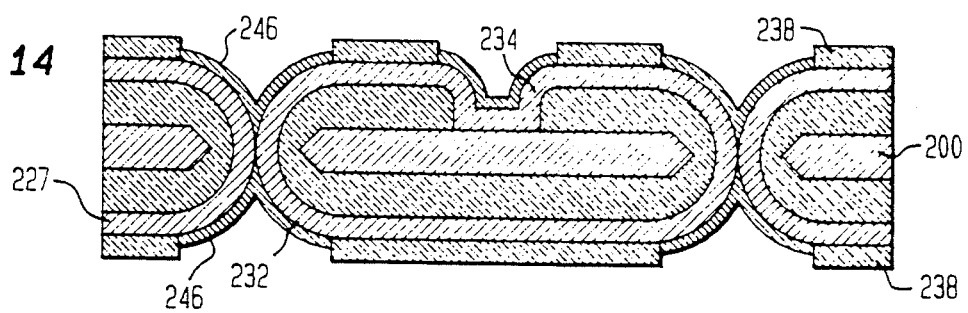
Figure 15:
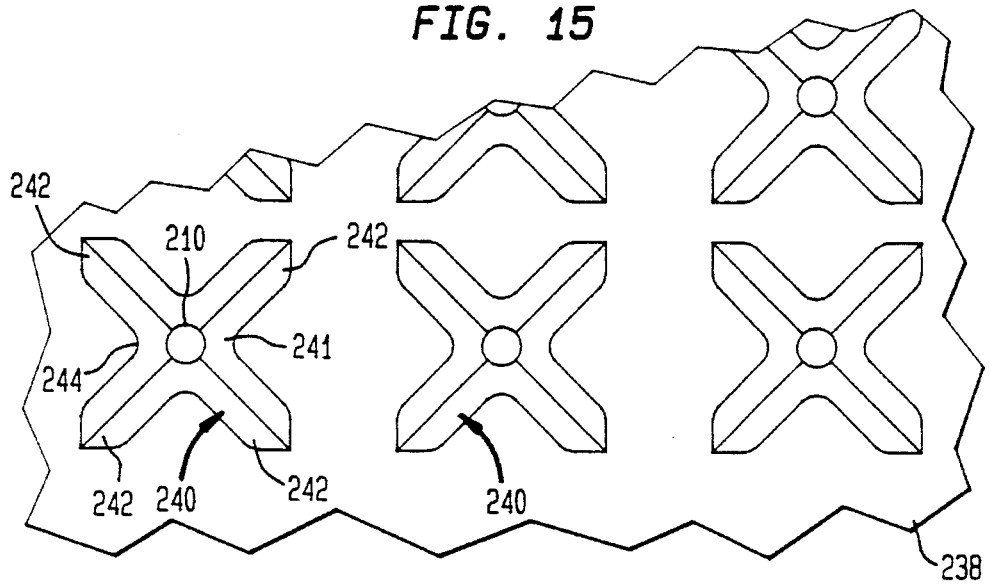

FIG. 15 is a diagrammatic, fragmentary plan view of the surface of the interposer shown in the sectional view in FIG. 14.

Figure 16:
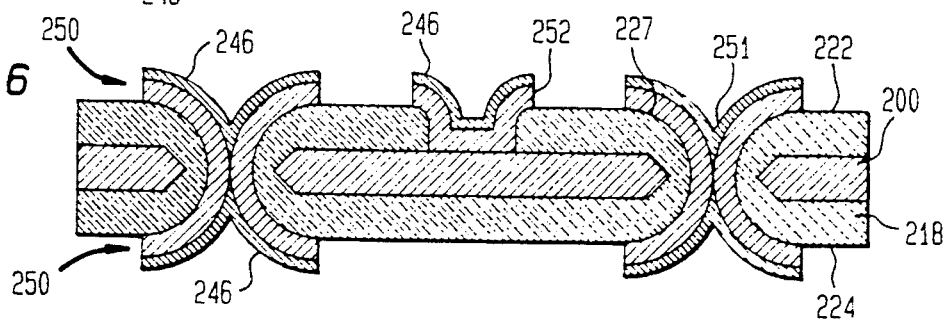

FIG. 16 is a view similar to FIGS. 10–15 but depicting the completed interposer.

Figure 17:
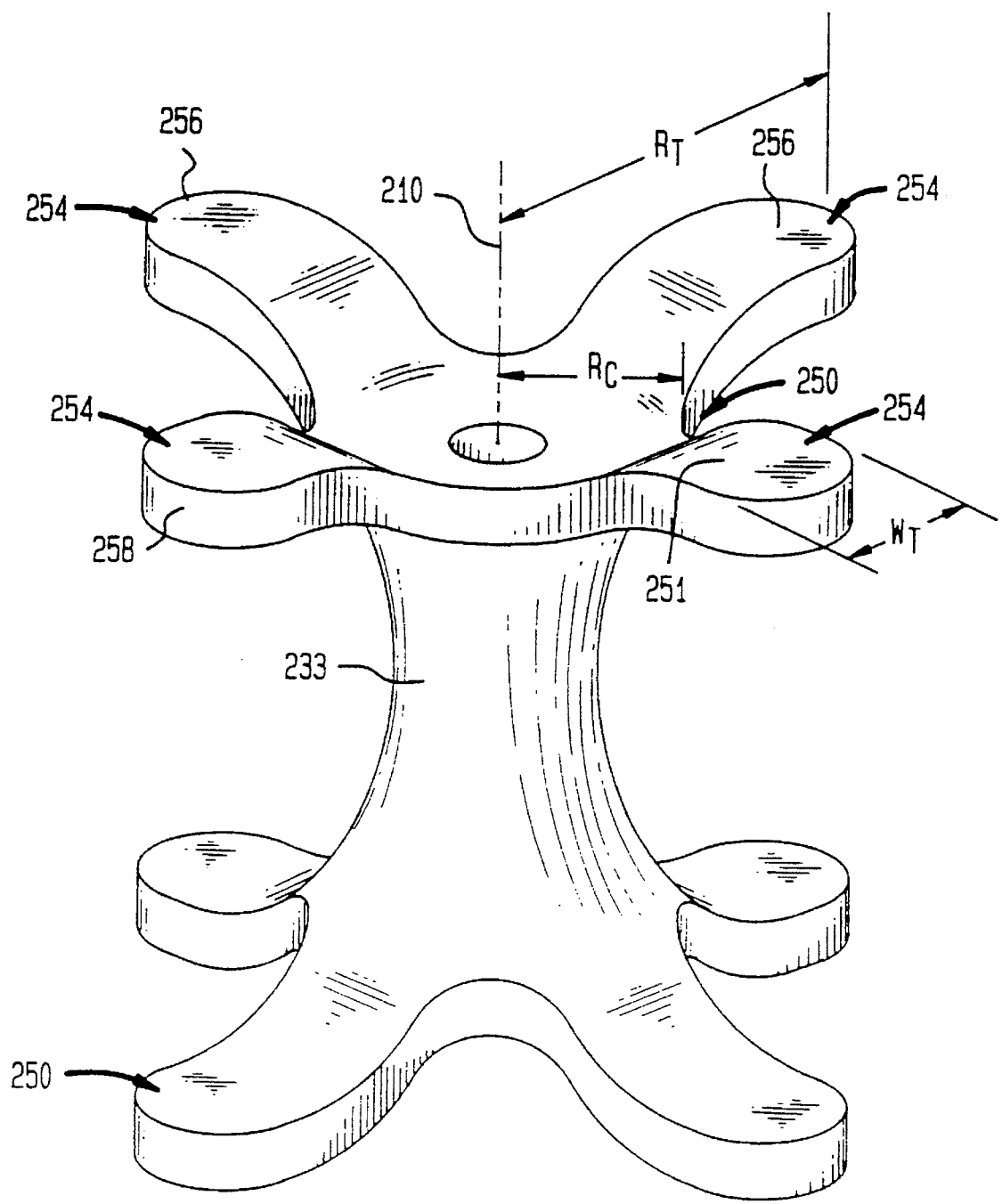

FIG. 17 is a diagrammatic perspective view depicting a through conductor and contacts of the interposer of FIGS. 10–16.

Figure 18:
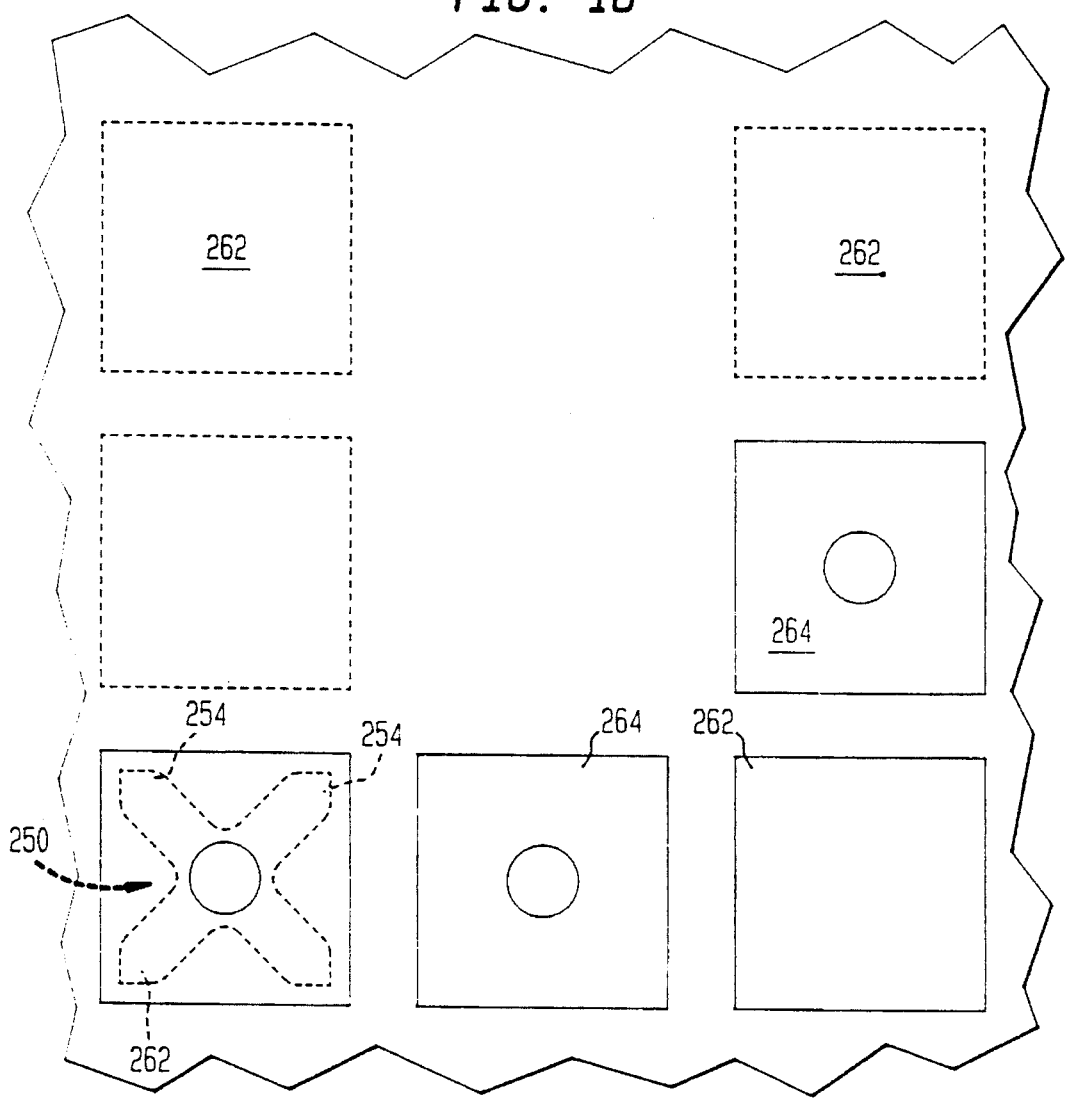

FIG. 18 is a fragmentary diagrammatic plan view depicting portions of stacked components during an assembly process using the interposer of FIGS. 10–17.

Figure 19:
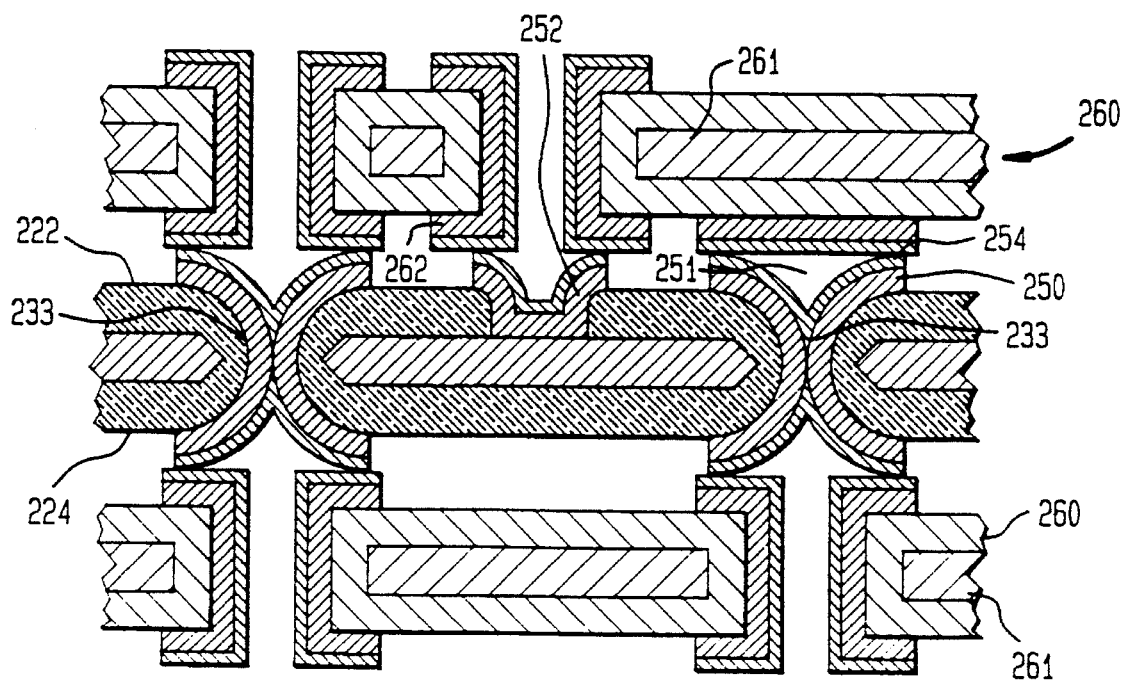

FIG. 19 is a diagrammatic sectional view taken along lines 19—19 in FIG. 18.

Figure 20:
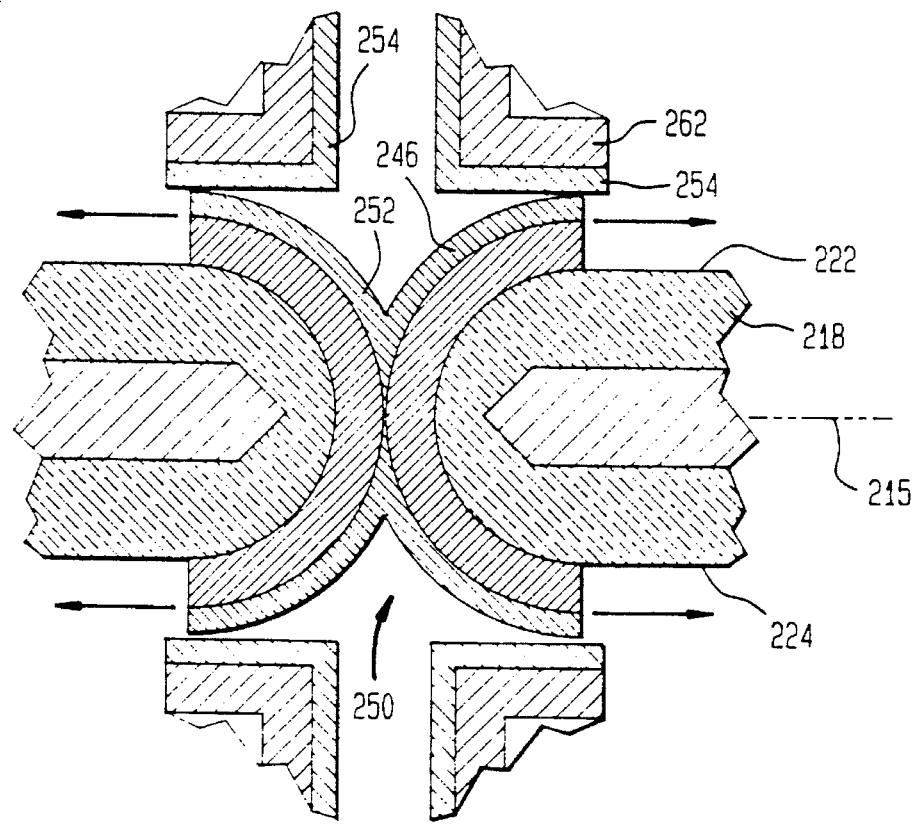

FIG. 20 is a fragmentary, diagrammatic sectional view on an enlarged scale depicting the components during a later stage of the assembly process.

Figure 21:
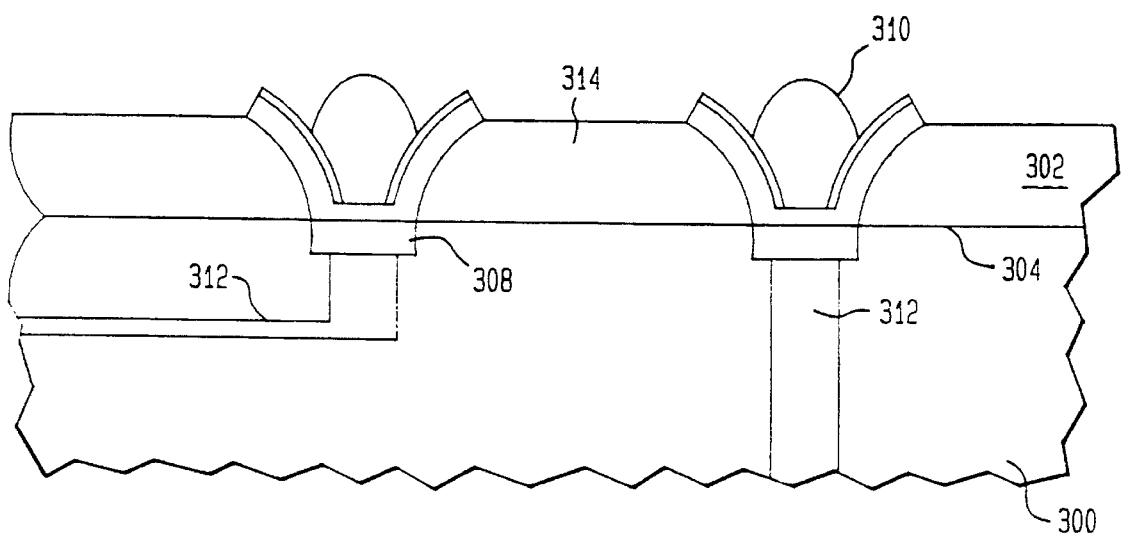

FIG. 21 is a fragmentary, diagrammatic sectional view depicting an interposer according to a further embodiment of the invention.

Figure 22:
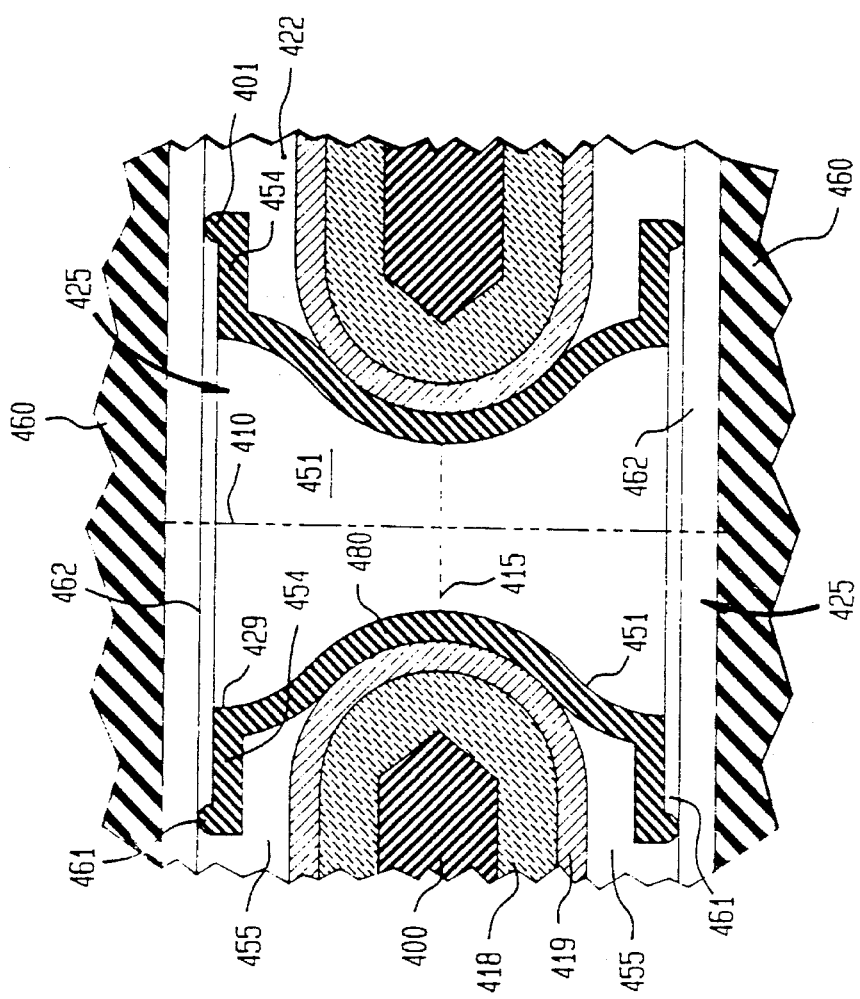

FIG. 22 is a fragmentary, diagrammatic sectional view depicting an interposer in accordance with yet another embodiment of the invention, in conjunction with other components during one stage of an assembly process.

Figure 23:
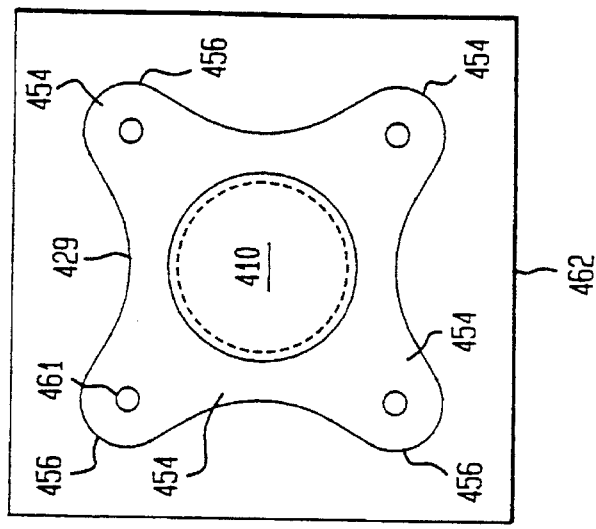

FIG. 23 is a view taken along line 23—23 in FIG. 22.

Figure 24:
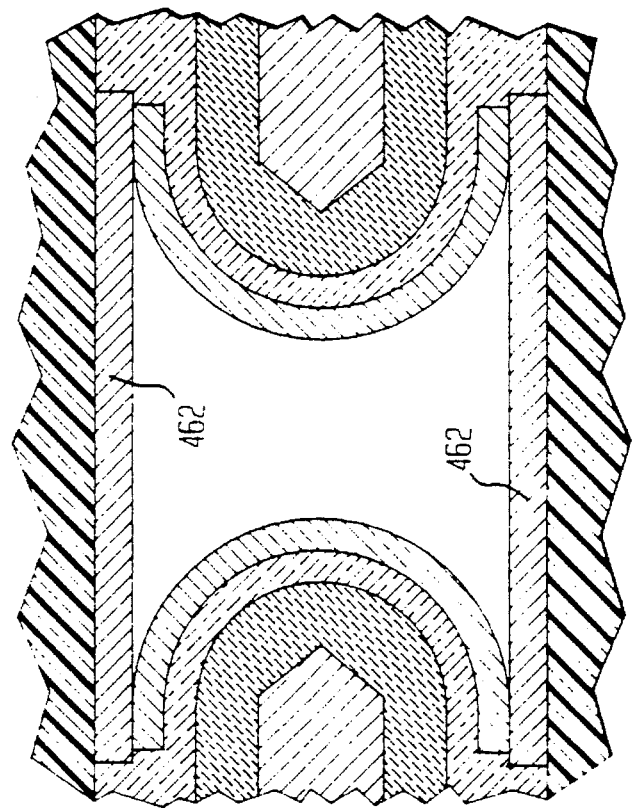

FIG. 24 is a view similar to FIG. 22 but depicting a later stage in the assembly process.

Figure 25:
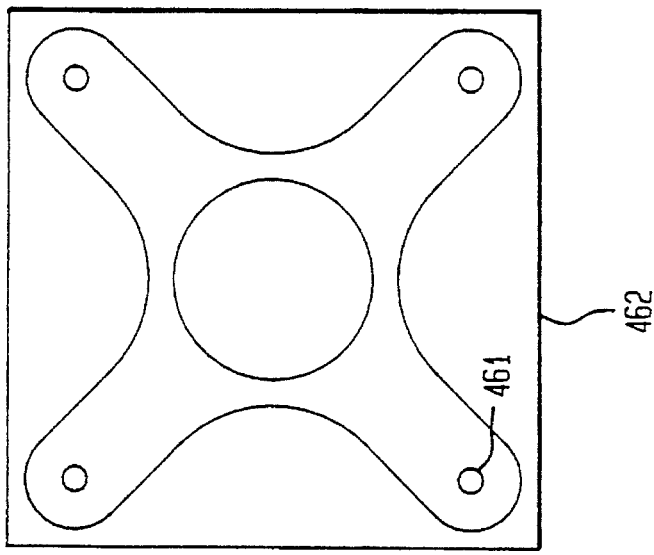

FIG. 25 is a view taken along line 25—25 in FIG. 24.

DETAILED DESCRIPTION OF TILE PREFERRED EMBODIMENTS

A process in accordance with one embodiment of the invention begins with a body 30 in the form of a sheet of a dielectric material having a first or top surface 32 and a second or bottom surface 34. The dielectric material should be a material having a relatively high elastic modulus such as a polyimide material. One suitable polyimide is available under the trademark UPILEX from the Ube Corporation. Sheet 30 desirably is about 15–50 microns ("μ") thick, and most preferably about 25μ thick. A layer 36 of a temporary layer material susceptible to etching by an etchant which does not attack body 30 is coated on top surface of the body 30. The temporary layer material desirably is a metal such as aluminum, tin, or nickel which can be removed by etching. Temporary layer 36 may be about 15–100μ or more thick, most desirably about 50μ thick. A second temporary layer 38 similar to layer 36 is applied to the bottom surface 34 of body 30.

Photoresist layers 40 and 42 are applied on the temporary layers 36 and 38 and then photographically exposed to develop openings 44 and 46, respectively. Resist layers 40 and 42 may be formed from a conventional photoresist material. However, dry film photo resists are preferred. One suitable resist is a dry film resist about 25μ thick of the type sold under the trademark DYNACHEM by Morton Electrical Materials of Tustin, Calif. Openings 44 and 46 are circular, as viewed in directions perpendicular to surfaces 32 and 34. Also, openings 44 and 46 are coaxial with one another on a common axis 48 perpendicular to the surfaces of body 30. Although only a single set of aligned openings is illustrated in the fragmentary view of FIG. 1, aligned numerous sets are provided in one or more arrays extending over the surfaces of the body. The spacing or "pitch" dimension between adjacent pairs of openings is selected to match the pitch of the pads on the panel or other element which will be mated with the interposer. Preferred structures according to this embodiment of the invention can be fabricated with pitch dimensions of 1.5 mm or less, preferably about 0.5 to 1.5 mm. Preferably, each set of aligned openings 44 and 46 are coaxial with one another within a tolerance of about 10μ. This degree of alignment can be achieved by conventional film handling and exposure devices such as a conventional two-sided exposure tool. Sheet 30 typically is provided with sprocket holes (not shown) in margins remote from the area used to form the interposer for handling and aligning the sheet. Alignment based on such holes normally will be adequate for this step.

In the next stage of the process, the sheet with the temporary layers and photoresist layers is exposed to an etchant, such as a caustic solution, adapted to etch the temporary layers 36 and 38 isotropically. That is, the etchant will attack the temporary layers at substantially equal rates in all directions, wherever the temporary layers are exposed to the openings. The etchants attack the first or top temporary layer 36 through opening 44 progressively, until the first or top surface 32 of body 30 is exposed. At the same time, however, the etchant undercuts photoresist layer 40, starting from the edge 50 defined by the periphery of opening 44 and the exposed surface of layer 36. Thus, the etching process forms an aperture 52 in first temporary layer 36, such aperture having a wall 54 substantially in the form of a surface of revolution about central axis 48. The generator of surface 54 is substantially in the form of an arc having its center approximately at the top surface of layer 36, i.e., at the surface of temporary layer 36 remote from body 30. Thus, wall 54 is generally in the form of a cup or a section of a toroid. The wall flares radially outwardly, away from central axis 48 in the vertically outward or upward direction away from body 30, i.e., upwardly as seen in FIG. 2. Thus, the first or top temporary layer 36 includes a rim 55 surrounding each hole 52. Rim 55 has progressively increasing thickness in the radial direction away from common central axis 48.

The same etching step also forms apertures 56 in the second or bottom temporary layer 38, these apertures being similar in configuration and diameter to apertures 52. Thus, the wall 58 of each aperture 56 is generally in the form of a surface of revolution about central axis 48, and flares radially outwardly, away from the central axis, in the vertically upward direction, away from body 30. As used in this disclosure with reference to features associated with a surface of a body, the term "upward" means the direction out of such surface, away from the center of the body. Thus, with reference to the second surface 34 of body 30, the "upward" direction is the direction toward the bottom of the drawing as seen in FIG. 2. Second temporary layer 38 includes rims of progressively increasing thickness 39 surrounding apertures 56. Each aperture 56 in the second layer 38 is substantially coaxial with the corresponding aperture in top or first aperture layer 36. After conventional rinsing and deactivating steps, holes 60 are formed in body 30 by ablating the material of the body. The ablation is performed by directing radiant energy onto first surface 32 through the holes 52 in the top or first temporary layer. The radiant energy may be applied using a laser, such as a KrF excimer laser of wavelength 308 nm. Temporary layer 36, and particularly rims 55 immediately surrounding the apertures protect body 30 from the impinging radiant energy. Thus, holes 60 are formed in the body of 30. Each hole 60 is coaxial with the corresponding aperture 52 in a layer 36 an hence with common axis 48 and with the corresponding aperture 56 in layer 38. The masking action of the top layer inherently adjusts the diameter of hole 60 to the diameter of the aperture at the apex of rim 55, i.e., the diameter at the juncture of rim 55 with sheet top surface 32. Thus, for each set of apertures, the peripheral wall 54 of the aperture in the top layer, the peripheral wall 62 of the hole 60 and the peripheral wall 58 of the apertures in second or bottom layer 38 are substantially continuous with one another. Absolute smoothness or continuity is not required. Thus, the radiant energy may spread outwardly beneath rim 55 of the first temporary layer, causing the diameter of hole 60 to vary slightly from the top surface 32 of body 2 to the bottom of surface 34. This may yield a small ridge, less than a few microns high, at the juncture of hole surface 62 with aperture surface 58, at the apex of rim 59. Such ridges normally do not impede the process.

After formation of holes 60, additional photoresist layers 64 and 66 are applied on the first or top temporary layer 36 and the second or bottom temporary layer 38 respectively. These layers initially bridge over the apertures in the temporary layers and thus hole 60 as well. Resist layers 64 and 66 may be formed by a dry film resist and may extend over the apertures and holes in the underlying layers without filling the same. The photoresist layers are exposed using conventional techniques to form pairs of openings 68 and 70 in the top and bottom resist layers respectively in alignment with holes 60 and hence coaxial with the apertures 52 and 56 in the temporary layers 36 and 38. Holes 68 are circular and slightly larger than the maximum diameter of the corresponding diameter of the corresponding apertures in layer 36, so that a small ledge 72 is formed around the periphery of each aperture. Likewise, each hole 70 is slightly larger than the maximum diameter of the corresponding aperture 56.

An electrically conductive structural material such as a metal is then deposited within hole 60 and within the apertures 52 and 56 in the temporary layer. The deposition process can be performed by seeding the surfaces of the holes and apertures, as with a palladium salt or other deposition promoting agent, and then applying the metal structural material by plating over the seeded layer. The seeding is performed before application of photoresist layers 64 and 66. The structural material may be applied as a continuous, integral layer 74 covering the peripheral surfaces 62 of the holes in the body and also covering the peripheral walls 54 and 58 of the apertures in the temporary layers. The structural material layer should extend radially outwardly from the apertures and covering ledges 72.

The structural material should be relatively ductile. Metals selected from the group consisting of gold, copper, tin, nickel and alloys and combinations thereof are preferred. Gold is particularly preferred where the structural material layer includes only one metal. The structural material layer desirably is about 2 to about 20µ thick, most preferably between about 5µ and about 10µ thick. Alternatively, structural material layer 74 may include several sublayers such as a structural metal sublayer, a diffusion barrier sublayer and a corrosion resisting sublayer. Particularly useful sublayered structural metal combinations are as follows.

TABLE 1

| STRUCTURAL METAL | DIFFUSION BARRIER | CORROSION RESIST |
|---|---|---|
| Copper | Nickel | Gold |
| Nickel | Cobalt | Palladium |
| Silver | None | Pd/Ni Alloy |

A further layer 76 of an electrically conductive bonding material is applied over structural metal layer 74 by conventional deposition processes such as electroplating. The electrically conductive bonding material may be a solder, braze, diffusion bonding material, eutectic bonding material, or polymer filled with electrically conductive particles. Preferably, the bonding material is adapted to become active and to bond at a predetermined elevated temperature. Some suitable bonding material compositions are indicated in Table 2 below. In Table 2, the entry under the heading "pad surface" refers to the preferred pad surface for mating with the particular bonding material. Also, conventional protective layers, such as a thin gold layer, may be applied over the conductive bonding material layer 76 to protect the same from corrosion prior to use.

TABLE 2

| TYPE | CONDUCTIVE BONDING MATERIAL | PAD SURFACE |
|---|---|---|
| Solder | Tin 95%, Silver 5% | Tin |
| Solder | Tin 60%, Lead 40% | Tin |
| Solder | Tin 63%, Lead 35%, Silver 2% | Gold |
| Braze | Tin 94%, Gold 6% | Gold |
| Diffusion | Gold 80%, Germanium 20% | Gold |
| Diffusion | Gold 80%, Tin 20% | Gold |
| Diffusion | Tin 90%, Silver 10% | Gold |
| Polymer | Silver 50% in Epoxy | Gold |

Figure 5:
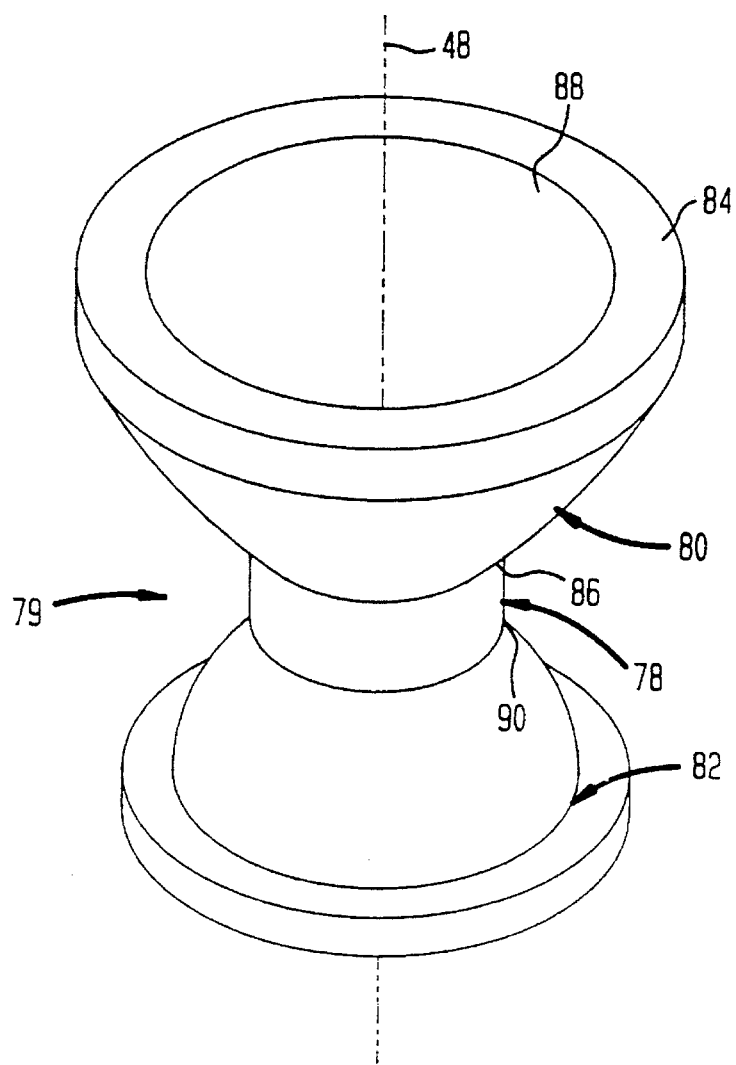
FIG. 5 is a diagrammatic perspective view depicting a through conductor and contacts of the interposer of FIGS. 1–4.
Figure 6:
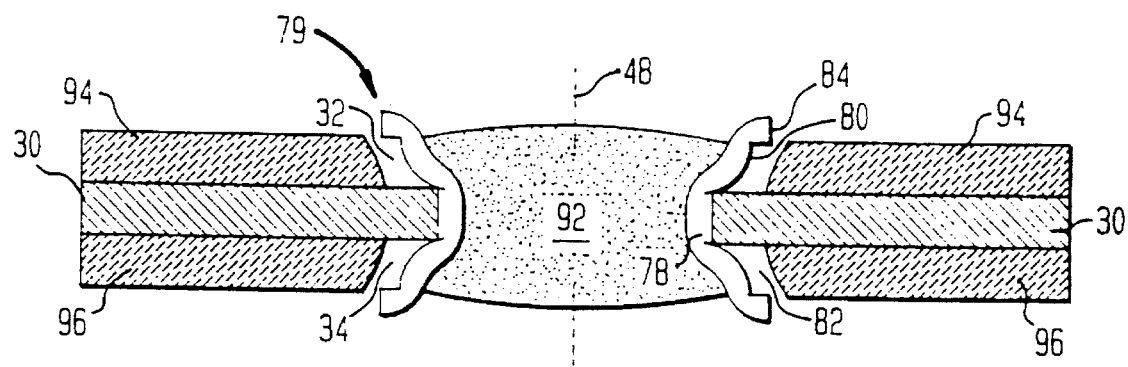
FIG. 6 is a further view similar to FIGS. 1–4 but depicting the completed interposer.

Structural metal 74 and bonding material 76 thus form integral vias, each such integral via including a through conductor 78 extending through layer 30, a contact 80 on the first side of body 30 and a further contact 82 on the opposite side of the body. One such via is depicted in FIG. 5. The first or top-surface contact 80 is generally cup-shaped, and extends radially outwardly, in horizontal directions away from central axis 48. The contact thus extends from the first end 86 of conductor 78 to a periphery 84 remote from the conductor and remote from central axis 48. The generally cup-shaped contact 80 defines an opening 88 facing upwardly, vertically outwardly, away from conductor 78 and hence away from the dielectric body 30 (FIG. 4). In this embodiment, the entire contact is a body of revolution around the central axis 48. Contact 82 at the second or bottom end 90 of conductor 78 has a similar configuration, but opens downwardly, in the opposite vertically outward or upward direction away from the second surface 34 of the body.

After the vias are formed, they are optionally filled with a flowable conductive fill material 92, as by stenciling or squeegee application over the temporary layers and vias. Fill material 92 desirably is arranged to remain solid at temperatures below the activation temperature of the conductive bonding material 76. Suitable fill materials include polymers and polymer precursors with conductive particles dispersed therein. The polymeric material may be a thermosetting material such as a B-staged or partially cured epoxy or a thermoplastic such as a polyimide siloxane. After filling, temporary layer 36 and 38 are removed by etching with a caustic solution. The etching process also removes any surface debris left from prior steps. Removal of the temporary layers leaves portions of the contacts spaced vertically from the surfaces of the body. Thus, cup-shaped contact 80 is spaced vertically above first surface 32 of body 30. The spacing increases progressively from zero at the juncture of the contact with conductor 78 to a maximum at the periphery 84 of the contact. Similarly, contact 82 is spaced in the opposite vertically outward direction away from second surface 34, the spacing increasing from zero at the juncture of the contact with conductor 78 to a maximum at the periphery of the contact.

After removal of the temporary layers, layers 94 and 96 of a flowable dielectric adhesive are applied on the surfaces of the body. The flowable dielectric material or adhesive is also selected to flow and form a bond with adjacent dielectric materials at a pre-selected activation temperature which is approximately equal to the activation temperature of conductive bonding material 76. The adhesive may be applied by methods such as screen printing, application of a dry film preform and squeegee application. Desirably, the thickness of the adhesive layers is less than the vertical extent of the contacts 80 and 82, so that the contacts protrude vertically beyond the adhesive layers. The adhesive may be a material commonly referred to as a "snap-cure adhesive". In this condition, the interposer is now ready for use.

Figure 7:
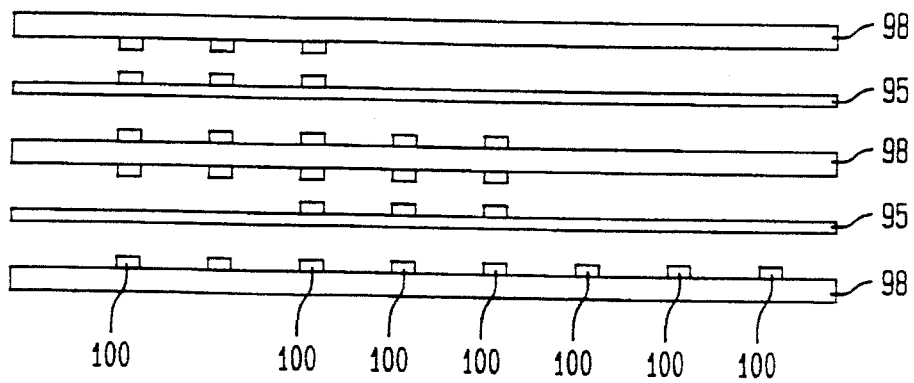
FIG. 7 is a diagrammatic elevational view depicting stacked components of the beginning of an assembly process using the interposer of FIGS. 1–6.
Figure 8:
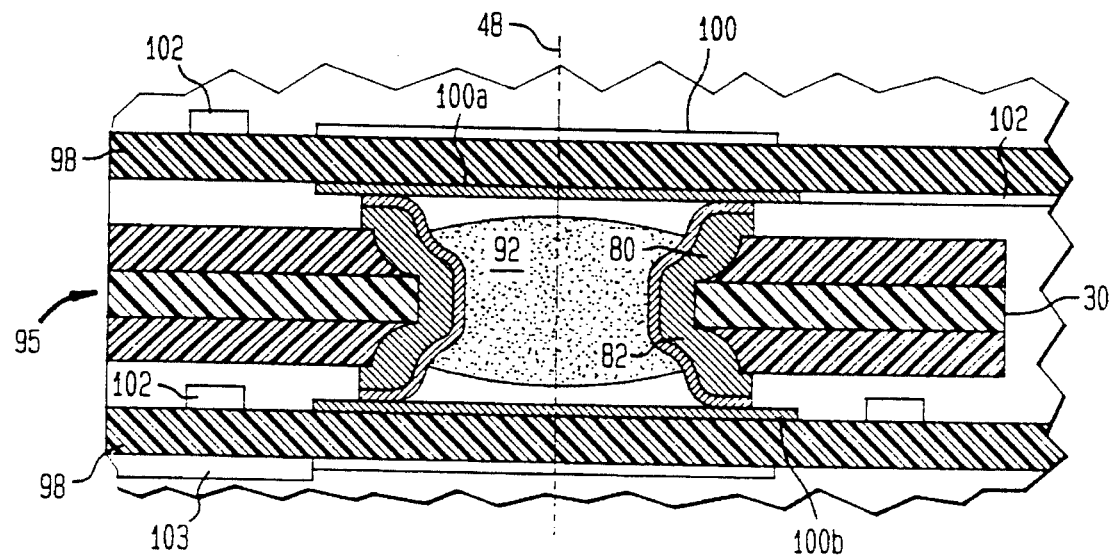
FIGS. 8 is a fragmentary, diagrammatic sectional view depicting a portion of the components illustrated in FIG. 7 at the beginning of the assembly process.

In a joining process according to a further embodiment of the invention, a plurality of interposers 95, such as the interposers made in the process of FIGS 1–6, are stacked in interleaved, alternating arrangements with a plurality of circuit panels 98 (FIG. 7) so that one interposer is disposed between each pair of adjacent circuit panels and so that the circuit panels and interposers are superposed on one another. The circuit panels are generally lamellar structures, i.e., platelike or sheet-like structures, having major surfaces with contact pads 100 thereon. Panels 98 also have conductors 102 (FIG. 8) extending in the horizontal directions (the directions to the left and the right and into and out of the plane of the drawing in FIGS. 7 and 8), as well as internal through conductors or vias (not shown) interconnecting the pads 100 on oppositely facing major faces of each panel 98 with one another. The stacking step serves to align the pads 100 with the contacts 80 and 82, so that each pad confronts and bears on the associated contact adjacent the periphery thereof. Each pad 100 thus bears on the associated contact 80 at locations remote from its central axis 48 and at locations where the contact is spaced vertically from body 30.

In the next stage of the process, the stack is compressed and heated, as by squeezing the stack between heated platens (not shown). The compression forcibly engages the contacts of the interposer with the pads of the circuit panels and compresses the contacts 80 and 82 vertically and axially in directions parallel to the central axis 48 and towards the medial plane of the interposer body. As each contact is compressed axially it expands radially outwardly, in horizontal directions, away from central axis 48. Thus, the cup-shaped contacts 80 and 82 tend to bend downwardly, toward the medial plane of the body, and outwardly. The action is generally similar to heading or clinching of a rivet. As each contact expands outwardly, it wipes across the surface of the associated pad 100 on the mating panel. This wiping action is particularly effective because it occurs under substantial axial or vertical loading during the compressing step.

Figure 9:
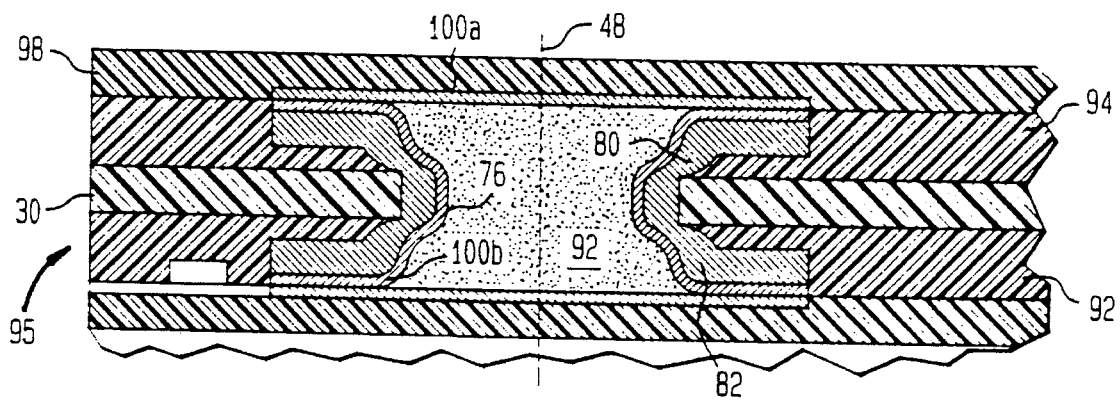
FIG. 9 is a view similar to FIG. 8 but depicting the components at a later stage in the assembly process.

This action continues as the panels move closer to one another during the compressing step, until the assemblage reaches the condition illustrated in FIG. 9. During this process, the flowable dielectric material or adhesive in layers 94 and 96 fills the spaces between the body 30 of each interposer and the major surfaces of the adjacent circuit panels. The dielectric material flows to fill the spaces between the conductors 102 on the surfaces of the panels. This forms a substantially unitary, multi-layered structure substantially free of voids. At the same time, the electrically conductive bonding material 76 on the contacts of the interposers forms a metallurgical bond with the pads 100 of the circuit panels. The metallurgical bonding action is greatly enhanced by the wiping action which occurs during the compressing step. The fill material 92 within each contact or via structure flows into engagement with the pads 100 engaged with such via structure. The flow of this fill material is effectively constrained by the surrounding walls of the contacts. Accordingly, the fill material will not contaminate adjacent features and cause shorting.

An interposer fabrication process according to a further embodiment of the invention begins with a conductive, preferably metallic sheet 200 (FIG. 10), such as 25% hard rolled and annealed copper about 30–70μ thick, typically about 50μ thick. The metal sheet is cleaned using conventional methods such as sulfuric peroxide etch, rinsed and then passivated or protected by washing in a passivating agent such as ethylene diazol. Resist layers 202 and 204 are applied on the surfaces of the sheet, as by laminating the layers as dry films. The resist layers desirably are about 50 microns thick. The resist is cured, as by baking, and then developed in a pattern including matched pairs of cylindrical holes 206 and 208 in the top and bottom layers 202 and 204 respectively. The holes of each pair are co-axial, on a common central axis, 210. The axes 210 are distributed in a regular grid pattern, at spacings as described above, typically 0.5 to 1.5 mm. In the next step, the sheet 200, is etched from both sides using an isotropic etching solution. Where the sheet is formed from copper or a copper alloy, the etching solution may be a solution of CuCl and HCl. As the etch attacks sheet 200 through the holes in the resist layers it perforates the sheet to form holes 212 centered on axes 210. Each hole 212 has a narrowest point or throat 214 adjacent the medial plane 215 of sheet 200, i.e, the plane equidistant from the top and bottom surfaces of the sheet. Each hole 212 has walls sloping radially outwardly from throat 214 to the surfaces of the sheet. A relatively slow etch rate, using moderate HCl concentration, is preferred for forming the sloping wall configuration. Each hole 212 may have a minimum diameter of about 100 to about 250 microns, preferably about 125 microns. The maximum diameters of each hole, at the surfaces of the sheet, typically are about 125 to about 300 microns.

After the holes are formed, resist layers 202 and 204 are removed. Dots 216 of a further resist are applied the top surface of sheet 200. Each such dot may be about 50 microns to about 100 microns in diameter. Resist 216 may have the same composition as resist layers 202 and 204, and may be applied by a similar process. Dots 216 are applied in a regular grid pattern offset from the grid pattern of holes 212 and axes 210. As further discussed below, the places covered by dots 216 will ultimately form contacts connected to sheet 200, which is used as a plane conductor, such as a ground plane or power plane in the finished structure. Accordingly, dots 216 are positioned in a grid matching the ground or power plane connection pads on the elements with which the interposer will be employed.

After application of resist dots 216, a conformal coating of a dielectric material 218 is applied over sheet 200. The conformal coating covers the sheet 200, including the surfaces within holes 212. The coating has a substantially uniform thickness on the surfaces of the sheet and within the holes. Desirably, the coating is between about 20μ and about 50μ thick, preferably about 38μ. The dielectric material preferably is applied by electrophoretic deposition. In the electrophoretic deposition process, sheet 200 is electrically connected to a potential source 220 and immersed with a counter-electrode in a bath of liquid electrophoretic deposition mixture. The potential applied by source 220 deposits solid material from the electrophoretic deposition mixture. Preferred electrophoretic deposition mixtures include materials supplied under the designation Powercron cationic acrylic (700–900 series), or Powercron cationic epoxy (400–600) by the PPG Company. Preferably, the conductive sheet 200 and the counterelectrode (not shown) extend horizontally in the bath, and are disposed at a uniform spacing from one another, typically about 2 cm. The counterelectrode should be larger than the sheet, so that the counterelectrode extends beyond the edges of the sheet. The current density during the electrophoretic deposition step preferably is maintained below about 1 milliampere per square centimeter so as to minimize bubble formation in the deposited coating. Desirably, the current is maintained constant during the deposition process. The potential applied may be about 100 V, and the process typically takes about 4 minutes. After the electrophoretic deposition process, the coated sheet or body is removed from the bath, washed to remove clinging undeposited solution and then baked to cure the deposited coating.

The deposited dielectric body 218 has a first or top surface 222 and a second or bottom surface 224, and has holes 226 extending entirely through the body from the first surface to the second surface. Holes 226 extend through the holes 212 of sheet 200 and have walls in the form of surfaces of revolution about central axis 210. Each hole 226 has a throat or smallest diameter point adjacent the medial plane of body 218, i.e., approximately at the medial plane 215 of sheet 200, and approximately midway between first surface 222 and second surface 224. The walls of each hole 226 flare radially outwardly from the central axis 210 in the axially outward directions, away from the medial plane 215 so that the diameter of each hole 226 gradually increases to a maximum at first surface 222 and second surface 224. Stated another way, each surface 222 and 224 includes a principal, planar portion and the holes form indentations 227 in surfaces 222 and 224, the indentations merging with one another at medial plane 215. Resist 216 is removed after deposition of the dielectric material, typically before the dielectric material is cured. Removal of resist 216 leaves additional indentations 228 extending inwardly from the first surface of 222 to the dielectric body to the metallic sheet 200.

In the next stage of the process, a structural material, such as the structural materials discussed above is plated on all of the surfaces of the dielectric body 218, including the interior surfaces of holes 226 and the indentations 228. The deposition process may include the steps of seeding the surfaces, as by exposure to a liquid seeding process or by sputter deposition. For example, an adhesion-promoting layer of chromium, typically about 0.1 microns thick may be applied followed by a 1 micron layer of copper. The seed layer 230 contacts metallic sheet 200 in indentations 228 and hence is electrically connected to the metallic sheet. The remainder of the structural material is then electroplated over seed layer 230 as by connecting an electroplating potential source 231 to metal sheet 200 and immersing the assembly in an electroplating bath with a counterelectrode (not shown). The structural material conforms to the shape of the dielectric body. As the structural material is deposited, it completely fills the throats or narrowest points of holes 226 so as to form a solid conductor 233 extending through each hole 226. However, the structural material does not completely fill those portions of the holes or indentations adjacent surfaces 222 and 224 of the body. Instead, the structural material is deposited as a layer on the outwardly curving walls of holes 226 so as to form an outwardly flaring, horn-shaped shell 232, integral with conductors 233, within each indentation 227 at surfaces 222 and 224. Similarly, indentations 228 are partially filled by the deposited material, which forms a similar outwardly flaring shell 234 at the opening of each such indentation on first surface 222. The structural metal also electrically connects each of the outwardly flaring shells 234 to the plane conductor or sheet 200. The structural metal additionally forms planar structures 236 covering the principal planar portions of surfaces 222 and 224 of the dielectric body.

In the next stage of the process, an additional resist 238 is applied over the structural metal layer. The structural metal also electrically connects each of the outwardly flaring shells 234 to sheet 200. Once again, an electrical potential may be applied through sheet 200, and hence applied to the structural metal by way of the shells of layers 234. For example, this resist may be deposited to a thickness of about 25 microns. One suitable resist is sold under the designation EAGLE electrophoretic resist by the Shipley company of Marlborough, Mass., and can be deposited to the desired thickness in about 3 minutes at about 200 volts. This resist is then cured by application of a cellulosic coating, drying and baking. Resist 238 is then exposed and developed in the conventional manner, using photographic exposure on both sides.

The photographic patterning is arranged to provide generally X-shaped openings 240 (FIG. 15) in resist layers 238. These openings are in registration with the shells 232 at through conductors 233 and in registration with the potential plane shells or vias 234. The openings 240 at each shell 232 is symmetrical about the central axis 210 of the shell. Each opening 240 includes a central zone 241 adjacent the central axis 210 and further includes slots 242 extending radially outwardly from central region 241, away from the central axis 210. The resist layer thus has projections 244 extending inwardly towards central axis 210. These projections start at locations on the flat metallic sheet 236 and extend radially inwardly to locations within the shells 232. Thus, the resist tabs 244 extend axially or vertically downwardly towards the medial plane 215 of the interposer body. Similar X-shaped openings 240 are provided at shells 234. As best appreciated with reference to FIG. 15, the through holes in the dielectric body, and thus the central axes 210, are disposed in a regular, rectilinear grid pattern of rows and columns. Slots 242 are arranged on diagonals of this grid. An electrically conductive bonding material, such as those discussed above is then plated onto the structure, within openings 240. The bonding material thus covers portions of shells 232 and 234 and also covers minor portions of the planar structures 236. At this stage of the process, all portions of the structural metal are still electrically continuous with sheet 200, and hence an electrical potential for plating can be applied through sheet 200 for electroplating.

Resist 238 is then stripped and the structural metal is etched. During this etching step, the bonding material 246 acts as an etching mask. Thus, the portions of the structural metal which were previously covered by resist layers 238 are removed. This exposes the planar parts of first surface 222 and second surface 224 of the dielectric body 218, and leaves contacts 250 having shapes corresponding to the X-shapes of windows 238. Contacts 250 are provided at both ends of each through conductor 233. As best seen in FIG. 17, each contact 250 includes a generally cup-shaped central portion 252, substantially in the form of a body of revolution about central axis 210, having a rim or outer edge at radius $R_c$ from the central axis. The contact further includes four tabs 254 projecting radially outwardly from the rim of the cup-shaped central portion, each such tab having a tip 256 at radius $R_t$ from axis 210. For contacts disposed in a rectilinear grids at a pitch or contact-to-contact spacing along the rows and columns of the grid between about 0.5 and 1.0 mm (about 20 to 40 mils), $R_t$ typically is between about 100μ and about 230μ. Stated another way, the maximum diameter of each contact, measured across the tips of oppositely-directed tabs, is less than about 0.5 mm and desirably less than about 400 μm. Preferably, $R_c$ is about 40 to about 100μ. The width $W_t$ of each tab, typically is about 25 to about 50μ and increases towards the central portion of the contact. The central portion 252 of each contact 250 is disposed within one of the indentations 227 in the surfaces 222 and 224 of the dielectric body, whereas the tabs 254 project vertically or axially outwardly from the central portions, and extend outwardly from the indentations in the surfaces to the surrounding planar portions of body surfaces. Tabs 254 extend along the diagonals to the rectilinear grid of axes 210. The tabs and central portions include a continuous structural metal layer 258, including portions originally formed as shells 232 and other portions originally included in the planar structures 236. The structural metal layer 258 of each contact 250 is continuous with the structural metal of the associated through conductor 233. The tabs and the central, cup-like portions slope radially outwardly, away from axis 210 in the vertically or axially outward direction, away from the medial plane of the body. In the same manner, the shells 232 are converted into plane-conductor contacts 252 (FIG. 16). Each such plane-conductor contact has substantially the same configuration as the through conductor contacts 250, but is metallurgically bonded to the plane conductor or sheet 200.

The interposer of FIGS. 10–17 may be assembled with circuit panels or other microelectronic components in an assembly procedure similar to that described above. In the assembly process, one of the interposers is stacked between each pair of circuit panels 260. Circuit panels 260 have internal plane conductors 261. Panels 260 also have signal pads 262 disposed in a regular, rectilinear grid pattern corresponding to the rectilinear grid of through conductors 233, contact axes 210 and contacts 250 in the interposer, and also have plane conductor connection pads 264, such as ground or power plane connection pads, at certain locations between signal pads 262. Pads 262 and 264 are substantially square. The sides of the pads extend in the row and column direction of the array of pads and hence the diagonals are aligned with the diagonals of the array.

In the stacking procedure, the signal pads 262 are brought into registration with the signal contacts 250, whereas the potential plane pads 264 are registered with plane conductor contacts 252. When the pads are brought into registration with the contacts 250, the tabs 254 of the contacts are aligned with the diagonals of the square pads 262. A contact 250 is illustrated in the broken lines in FIG. 18 superposed on one pad 262. All of the other signal contacts 250 and plane conductor contacts 252 are similarly oriented on the associated pads. Although only two panels and one interposer are illustrated in FIG. 19, the stacking step may be performed with any number of panels and interposers interleaved with one another.

In this process as well, the stacked elements are compressed and heated. Desirably, a vacuum is applied during the compressing step to remove air from between the panels and interposers. As the stacked elements are compressed, the pads 262 of the circuit panels bear on the peripheries of the contacts 250, i.e., on the tabs 254 adjacent to tips thereof. As best illustrated in FIG. 20, this action tends to bend the tabs downwardly towards the medial plane 215 of the interposer, and tends to force each tab 254 into the adjacent surface 222 or 224 of the dielectric body 218. The heat applied during this procedure softens dielectric 218 and hence facilitates bending of the tabs. As the tab bends downwardly, the tip of the tab moves radially outwardly form the central axis 210 of the contact. This again causes the surface of the tab to wipe over the surface of the engaged pad. As pointed out above, the wiping action promotes formation of an effective electrical connection. Because the tabs are separated from one other at their tips, the tabs can be bent radially outwardly in this fashion without tearing or substantially cracking the structural material. Further, the individual tab tips have relatively small surface areas, and can be pushed into the underlying dielectric 218. The cup-shaped central portion 251 of each contact tends to be more rigid than the tabs. However, the central portion is disposed in an indentation in the body surface, so that the central portion recessed relative to the tips of the tabs and relative to the principal plane of the body surface. The central portion therefore does not engage the pad and does not substantially impede bending of the tabs. The plane conductor contacts 252 operate in the same manner. The heat applied during the process also activates the conductive bonding material 246 so as to form a permanent connection between the tabs of the contact and the associated pad.

The dielectric material on the interposer desirably flows to an extent sufficient to fill spaces between the interposers and panels, including spaces around the raised conductors on the panel surfaces. The dielectric material of the interposer preferably also adheres to the materials of the circuit panel. To promote adhesion, the dielectric material may be only partially cured during the interposer fabrication step. Curing of the dielectric material may be completed during the compression and heating steps of the assembly process.

Numerous variations and combinations of the features described above can be utilized without departing from the present invention as defined by the claims. In one such variant, the surfaces of the contacts which engage the pads may be provided with small bumps or asperities to provide a scraping action during the wiping motion. Alternatively or additionally, asperities can be provided on the contact pads of the circuit panels. The asperities can be formed from the structural material, or preferably, from the electrically conductive bonding material on the surfaces of these elements.

Although the interposers typically are used in engagement with circuit panels to form multi-layer circuitry, they can also be employed with other microelectronic elements, such as semiconductor chips, active or passive components, flat flexible cables and the like. The components incorporating the contacts are referred to herein as "interposers" because the components commonly used between other elements, but the interposers need not be configured for such use. For example, an interposer may have only one surface bearing contacts, and the contacts may be linked to a plane conductor, to through conductors, or other conductors on or within the interposer. The interposer body can be integral with the body of a microelectronic component such as a semiconductor chip, a printed circuit board, a ceramic or other multi-chip module base, a flex cable, a chip capacitor or other microelectronic components. For example, as illustrated in FIG. 21, an interposer body 300 includes a dielectric layer 302 deposited on the front surface 304 of a semiconductor chip. Dielectric sheet 302 is provided with holes in alignment with the connection pads 308 of the chip. Contacts 310, similar to contacts 250 discussed above with reference to FIGS. 10–20, are provided at holes. Each contact 310 is permanently connected to the associated connection pad 308 of the chip, and hence connected to the internal electrical conductor 312 of the chip. For example, the contact may be metallurgically bonded to the connection pad of the chip during a deposition process used to form the contact. The exposed surface 314 of dielectric layer 302 constitutes the first or contact-bearing surface of this single-sided interposer. In use, this first surface is juxtaposed with a surface of a substrate or other electrical component, and the contacts are engaged with connection pads on the substrate and bonded thereto using a process substantially as discussed above. The contacts in this structure as well may incorporate electrically conductive bonding material, and the dielectric layer 302 may incorporate flowable dielectric materials, adhesives or the like.

In other variants of the invention, contacts having outwardly projecting tabs may include more than four or fewer than four tabs. Also, the tips of the tabs are positioned above the surface of the interposer body, with a gap therebetween to facilitate downward bending of the tabs.

The structures illustrated in FIGS. 22–25 have contacts 425 incorporating such gaps. Each contact 425 includes a central portion 451. Each such central portion is generally in the form of a hollow body of revolution having a central axis 410 perpendicular to the surface 422 of the interposer and a generator curving away from the central axis. The central portions of the contacts merge with tubular through conductors 480 adjacent the medial plane 415 of the interposer body. A small rim 429 extends radially outwardly, away from axis 410, at the top end of the central portion, remote from the medial plane.

Four tabs 454 are connected to the rim of each contact. The tabs extend radially outwardly, away from the central axis. Each tab has a small bump or asperity 461 adjacent its radially outermost tip 456. As best seen in FIG. 23, the tips of tabs 454 are rounded as seen in plan view. The edges of each tab slope away from one another in the radially inward direction, away from the tip 456 of the tab, so that each tab widens and joins smoothly with rim 429 of the central portion and with the next adjacent tab. Thus, the tabs cooperatively define a structure in the form of a rounded and smooth X-shape, with curved edges at junctures between adjacent tabs, i.e., at the junctures of the tabs and rim 429. The peripheral portions of each contact, including at least the tips of tabs 454 are spaced vertically above the surfaces of the interposer body, so that there are gaps 455 below the tips of the tabs.

The interposer body includes a metallic sheet or plane conductor 400 similar to the plane conductors discussed above, together with a composite dielectric layer. The composite includes a first layer 418 of an electrophoretically deposited polymer, desirably a thermosetting polymer such as the epoxy compositions discussed above, in contact with the plane conductor or sheet 400. A second layer of a flowable dielectric material, such as a relatively heat-resistant thermoplastic material, overlies the first layer. One such flowable dielectric material which may be used is a polyetherimide sold under the registered trademark ULTEM.

Structures according to this arrangement can be fabricated using techniques similar to those discussed above. Thus, the interposer body can be formed using deposition techniques similar to those used to form the interposer body of FIGS. 10–20. A temporary layer similar to those discussed above with reference to FIGS. 1–9 is then applied on the surfaces of the body and removed after deposition of the structural material of the contacts and through conductors. As in the processes discussed above, removal of the temporary layer leaves the peripheral portions of the contact, in this case including tabs 454, spaced vertically above the surfaces of the interposer body.

In an assembly process, the interposer is stacked with circuit panels other microelectronic devices, and then compressed. One such panel or element 460 is juxtaposed with each surface of the interposer. The condition of the assembly immediately after stacking but before compression is shown in FIGS. 22 and 23. As discussed above, the panels have square connection pads 462, and tabs 454 lie along the diagonals of the square connection pads. When the stacked elements are compressed, the contacts deform as indicated schematically in FIGS. 24 and 25. The tabs 454 deform radially outwardly, away from the central axis 410, and also bend downwardly, into engagement with the adjacent surfaces 422 of the body. In this action, the tips 454 of the interposer and asperities 461 on the tabs wipe radially outwardly over the surfaces of connection pads 462. The joining material on the contacts thus can form an effective bond between the tabs and the connection pads. The downward or axial movement of the contact periphery, particularly of tabs 454 also compensates for vertical tolerances in the assembly. That is, if the connection pads 462 of the mating elements are not perfectly coplanar, or if the contacts themselves vary slightly in height, the differences will be taken up by differences in the amount of deformation in the tabs. This contributes to the reliability of the assembly.

The dielectric materials of the interposer, particularly the flowable dielectric adhesive 419, fill any minor spaces beneath the contacts and around the contacts and the connection pads. Here again, the dielectric materials also fill spaces around irregularities on the surfaces of the circuit panels. For example, where the circuit panels have conductors on their exposed surfaces, the dielectric materials desirably fill the spaces between such conductors so as to provide a substantially void-free interface.

In still further variants, the fill material used in the embodiment of FIGS. 1–9 may be omitted or, conversely, such a fill material can be included in the structure of FIGS. 10–20, as by positioning the fill material within the cup-shaped central portions 251 of the contacts. Also, the dielectric interposer body can be fabricated by other techniques. For example, the dielectric material of the body can be molded, as by injection molding, compression molding, plastisol techniques, solvent casting or other known molding techniques. The molded part may have holes and indentations shaped as discussed above with reference to FIGS. 10–20. A plane conductor may be incorporated in such a molded part, as by insert molding. As these and other variations and combinations of the features discussed above can be utilized without departing from the present invention, the foregoing description of the preferred embodiments should be taken by way of illustration, rather than by of limitation of the invention described in the claims.

What is claimed is:

1. A method of making a multilayer circuit comprising the steps of:

(a) stacking a circuit panel and an interposer so that a first surface of said interposer confronts a surface of said panel, said interposer having a body and conductors having ends adjacent a surface of the body and having a contact at each said conductor end, each said contact including a peripheral portion surrounding the associated conductor end, said peripheral portions of said contacts confronting pads on the circuit panel; and (b) compressing said stacked panel and interposer so as to forcibly engage said peripheral portions of said contacts with said contacts and expand the peripheral portion of each contact radially outwardly away from the associated conductor end so that each said peripheral portion moves horizontally with respect to the engaged pad and wipes the surface of the pad.

2. A method as claimed in claim 1 wherein, during said compressing step, each said peripheral portion moves vertically downwardly toward the body of the interposer.

3. A method as claimed in claim 2 wherein said stacking step includes the step of stacking a plurality of circuit panels and at least one said interposer in interleaved, vertically alternating arrangement so that one said interposer is disposed between each pair of circuit panels, and so that oppositely-directed first and second horizontal surfaces of each said interposer confront surfaces of said panels, the conductors of each said interposer including through conductors extending through the body of the interposer and having said ends and said contacts at said first and second surfaces, whereby pads on said plural panels will be interconnected with one another by said through conductors.

4. A method as claimed in claim 1 further comprising the step of bonding said contacts to said pads.

5. A method as claimed in claim 4 wherein said bonding step includes the step of momentarily heating said stacked panels and interposers to thereby activate electrically conductive bonding material at interfaces between said contacts and said contacts.

6. A method as claimed in claim 5 wherein said bonding material is carried on said contacts.

7. A method as claimed in claim 5 wherein each of said peripheral portions wherein said momentary heating step causes softening of the body, thereby facilitating vertical movement of said peripheral portions in said compressing step.

8. A method as claimed in claim 1 wherein each said contact defines a recess and has a flowable conductive material disposed in said recess, said flowable conductive material being engaged with said pads in said stacking and compressing steps.

9. A method as claimed in claim 1 further comprising the step of causing a dielectric bonding material to flow at interfaces between said interposers and said panels during said compressing step so as to fuse said interposer and panel into a substantially unitary mass.

10. A method as claimed in claim 9 wherein said step of causing said bonding material to flow includes said momentary heating step.

11. A method as claimed in claim 1 wherein each said contact includes a plurality of tabs extending generally radially outwardly away from the associated conductor end, and wherein during said compressing step, each said tab is bent so that a tip of each tab remote from the associated conductor end moves downwardly towards the interposer body and horizontally away from the conductor end.

12. A method as claimed in claim 11 wherein said tabs of each said contact are initially disposed in a substantially symmetrical pattern around the associated conductor end.

13. A method as claimed in claim 11 wherein all of the tabs in each said contact are engaged with the same pad in said stacking step.

14. A method of making a circuit assembly comprising the steps of:

(a) stacking a circuit panel and an interposer in vertically superposed arrangement so that a first horizontally-extensive surface of said interposer confronts a first horizontally-extensive surface of the circuit panel and so that a plurality of electrically conductive contacts on said first surface of said interposer confront pads on the circuit panel;

(b) compressing said stacked panel and interposer vertically so as to forcibly engage said contacts with said pads and cause said contacts to deform so that at least a portion of each contact engaged with a pad moves horizontally with respect to the pad engaged pad and wipes the surface of the pad; and (c) bonding each said contact to the engaged contact.

15. A method as claimed in claim 14 wherein said bonding step includes the step of activating a bonding material at interfaces between said contacts and said pads by momentarily heating the stacked interposer and circuit panel, said bonding material being present on said contacts, said pads or both prior to said stacking step.

16. A method as claimed in claim 14 wherein said interposer includes a dielectric layer at said horizontally-extensive surface, each said contact includes a portion in contact with said dielectric layer and bearing on the engaged contact during said compressing step, said momentary heating softening said dielectric layer to facilitate deformation of said contacts.

17. A method as claimed in claim 14 wherein each said contact includes a central portion and a peripheral portion surrounding the central portion, said peripheral portion of each said contact engaging the associated pad during said compressing step, said central portion of each said contact remaining substantially disengaged from the pad during said compressing step.

18. A method of making a microelectronic interposer comprising the steps of:

(a) providing a body defining a first surface;

(b) providing a first temporary layer on said surface, said temporary layer having apertures therein;

(c) depositing a layer of an electrically conductive structural material in each said aperture so that said structural material extends over the temporary layer to thereby form contacts;

(d) connecting said contacts to conductors within said body; and (e) removing said temporary layer, leaving said contacts with outwardly flaring peripheral portions spaced vertically above said surface of said body.

19. A method as claimed in claim 18 wherein said body has holes extending inwardly from said surface in registration with said apertures in said temporary layer, said step of connecting said contacts to conductors including the step of forming said conductors by depositing said structural material in said holes during said step of depositing said structural material in said apertures so that said conductors are formed integrally with said contacts.

20. A method as claimed in claim 19 wherein said body defines a second surface opposite from said first surface, and said holes in said body extend from said first surface to said second surface.

21. A method as claimed in claim 20 further comprising the step of providing a second temporary layer on said second surface with apertures in registration with said holes, said depositing step including the step of depositing said structural material in said apertures of said second temporary layer so that said structural material extends on said second temporary layer, so as to form contacts on said second surface integral with said conductors and said contacts on said first surface.

22. A method as claimed in claim 21 wherein said step of providing said body includes the step of forming said holes so that wall surfaces of said holes in said body are substantially continuous with the walls of said apertures in said temporary layers.

23. A method as claimed in claim 17 wherein said step of forming said holes in said body is performed after said step of applying said temporary layers with said apertures on said body, by removing material from said body while using said temporary layers as masks.

24. A method as claimed in claim 18 wherein each said aperture has a central axis and having walls flaring horizontally outwardly, away from said central axis in the vertically upward direction away from said first surface, said step of depositing said structural material including the step of depositing said structural material on said outwardly-flaring walls.

25. A method as claimed in claim 18 wherein said temporary layer is formed from a metal selected from the group consisting of aluminum, tin, and nickel wherein said step of providing said temporary layer includes the steps of depositing said metal as a layer on said surface of said body and forming said apertures by masking the deposited metal layer so that the mask has openings and exposing the masked layer to an isotropic etchant through said openings.

26. A method as claimed in claim 18 wherein said temporary layer includes a photoresist.

27. A method of making a microelectronic interposer comprising the steps of:
(a) providing a body having a first surface including a principal portion with open indentations therein, each said indentation having a central axis substantially normal to the principal portion of the surface and a wall substantially in the form of a surface of revolution flaring outwardly away from the central axis and merging with the principal portion of the surface, said body including a dielectric material defining said first surface;

(b) depositing an electrically conductive structural material in said indentations to form a layer on said walls; and (c) controlling the horizontal extent of each said layer so that each said layer forms a plurality of tabs extending radially outwardly from the central axis.

28. A method as claimed in claim 27 wherein said step of providing said body includes the step of providing said body with a second surface directed oppositely from said first surface, said second surface also having said indentations, the indentations of said second surface being aligned with and connected to indentations of said first surface, each pair of connected indentations forming continuous holes flaring outwardly at both surfaces and having a narrow throat remote from said first and second surfaces, said depositing step including the step of depositing said structural material as a continuous body from said first surface to said second surface within each said hole.

29. A method as claimed in claim 28 wherein said depositing step is conducted so as to substantially fill the throat of each said hole to form a solid conductor integral with said tabs.

30. A method as claimed in claim 28 wherein said step of providing a body includes the steps of providing a sheet having holes therein and depositing a coating of a dielectric material on said sheet so that said coating conforms to said sheet.

31. A method as claimed in claim 30 wherein said step of providing said sheet includes the step of etching said sheet from opposite sides to form said holes, so that said holes taper to narrowest points at a medial plane, remote from the surfaces of the sheet.

32. A method as claimed in claim 30 wherein said sheet is electrically conductive and said step of depositing a coating includes the step of electrophoretically depositing the dielectric material by applying a potential to said sheet.

33. A method as claimed in claim 32 further comprising the steps of depositing spots of a resist on said sheet prior to said step of depositing said coating and removing said spots after said step of depositing said coating so as to leave openings extending from a surface of said coating to said sheet, said step of depositing said structural material including the steps of depositing a seed layer on said dielectric layer so that said seed layer is electrically connected to said sheet in said openings, electroplating said structural material over said seed layer by applying an electrical potential to said sheet.

34. A method as claimed in claim 33 further comprising the step of depositing an electrically conductive bonding material over said structural material in a pattern defining said plurality of tabs, said step of controlling the horizontal extent of said strucutral material layer including the step of etching said structural material after depositing said bonding material so that said bonding material acts as an etching mask.

\* \* \* \* \*

UNITED STATES PATENT AND TRADEMARK OFFICE
CERTIFICATE OF CORRECTION

PATENT NO. : 5,590,460

DATED : January 7, 1997

INVENTOR(S) : DiStefano et al.

It is certified that error appears in the above-identified patent and that said Letters Patent is hereby corrected as shown below:

Column 1, line 36, after the words "mounted to" insert the words -- items --.

Column 3, line 19, before the word "pedestals" delete "a".

Column 3, line 61, after the word "disclosed" insert the word -- in --.

Column 4, line 5, change "elements" to read -- element --.

Column 4, line 42, after the word "engagement" insert the word -- with --.

Column 6, line 57, before the word "Preferably" change the word "contacts" to read -- pads --.

Column 7, line 5, change "includes" to read -- include --.

Column 8, line 56, after the words "present invention" insert the word -- which --.

Column 9, line 55, change "TILE" to read -- THE --.

Column 11, line 22, change "an" to read -- and --.

Column 14, line 67, after the word "applied" insert -- to --.

Column 16, line 53, change "is" to read -- are --.

UNITED STATES PATENT AND TRADEMARK OFFICE
CERTIFICATE OF CORRECTION

PATENT NO. : 5,590,460
DATED : January 7, 1997
INVENTOR(S) : DiStefano et al.

It is certified that error appears in the above-identified patent and that said Letters Patent is hereby corrected as shown below:

Column 18, line 40, after the word "portion" insert -- is --.

Column 19, line 7, after the word "components" insert -- are --.

Column 20, line 27, after the word "panels" insert -- and --.

Column 21, line 8, after the word "by" insert -- way --.

Column 22, line 27, after "the" delete the word -- pad --.

Signed and Sealed this

Twenty-seventh Day of May, 1997

Attest:

BRUCE LEHMAN

Attesting Officer

Commissioner of Patents and Trademarks